(12) United States Patent
Sato et al.

(10) Patent No.: US 10,919,195 B2
(45) Date of Patent: Feb. 16, 2021

(54) IMPRINT APPARATUS AND METHOD OF MANUFACTURING ARTICLE

(71) Applicant: CANON KABUSHIKI KAISHA, Tokyo (JP)

(72) Inventors: Kazuhiro Sato, Utsunomiya (JP); Noriyasu Hasegawa, Utsunomiya (JP); Takahiro Matsumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 4 days.

(21) Appl. No.: 16/381,353

(22) Filed: Apr. 11, 2019

(65) Prior Publication Data

US 2019/0240880 A1    Aug. 8, 2019

Related U.S. Application Data

(62) Division of application No. 15/100,666, filed as application No. PCT/JP2015/051950 on Jan. 20, 2015, now Pat. No. 10,300,640.

(30) Foreign Application Priority Data

Jan. 24, 2014   (JP) ................................ 2014-011784

(51) Int. Cl.
    *B29C 43/58*      (2006.01)
    *G03F 7/00*       (2006.01)
    (Continued)

(52) U.S. Cl.
    CPC .......... *B29C 43/58* (2013.01); *B29C 35/0805* (2013.01); *B29C 43/52* (2013.01);
    (Continued)

(58) Field of Classification Search
    CPC ...... G03F 7/0002; G03F 7/001; G03F 7/0032; G03F 7/20; G03F 7/2004; G03F 7/2008;
    (Continued)

(56) References Cited

U.S. PATENT DOCUMENTS 4,560,249 A    12/1985   Nishiwaki et al.
4,734,746 A     3/1988   Ushida et al.
              (Continued)

FOREIGN PATENT DOCUMENTS

CN    102162992 A    8/2011
CN    103048878 A    4/2013
              (Continued)

OTHER PUBLICATIONS

International Search Report issued in Intl. Appln. No. PCT/JP2015/051950 dated Apr. 14, 2015.
(Continued)

*Primary Examiner* — Robert C Dye
*Assistant Examiner* — Taryn Trace Willett
(74) *Attorney, Agent, or Firm* — Rossi, Kimms & McDowell LLP

(57) ABSTRACT

The present invention provides an imprint apparatus that molds an imprint material on a shot region of a substrate by using a mold, comprising a detection unit configured to detect first light with which a first mark of the mold and a second mark of the substrate are irradiated and measure a position deviation between the first mark and the second mark, a heating unit configured to irradiate the substrate with second light for heating the substrate and deforming the shot region, and a control unit configured to control alignment between the mold and the substrate based on the position deviation, wherein a parameter of the detection unit or the heating unit is set not to detect the second light by the detection unit while the first light is detected and the substrate is irradiated with the second light.

25 Claims, 10 Drawing Sheets

(51) Int. Cl.
    *B29C 35/08*    (2006.01)
    *B29C 43/52*    (2006.01)
    *G01B 11/14*    (2006.01)
    *G02B 5/18*     (2006.01)
    *G02B 27/14*    (2006.01)
    *H01L 21/56*    (2006.01)
    *B29L 31/34*    (2006.01)
    *G02B 5/20*     (2006.01)

(52) U.S. Cl.
    CPC ............ *G01B 11/14* (2013.01); *G02B 5/1861* (2013.01); *G02B 27/141* (2013.01); *G03F 7/0002* (2013.01); *H01L 21/565* (2013.01); *B29C 2035/0827* (2013.01); *B29C 2043/585* (2013.01); *B29C 2043/5816* (2013.01); *B29L 2031/34* (2013.01); *G02B 5/20* (2013.01)

(58) Field of Classification Search
    CPC .. G03F 7/203; G03F 7/70375; G03F 7/70425; G03F 7/70433; G03F 7/70441; G03F 7/7045; G03F 7/70458; G03F 7/70466; G03F 7/70475; G03F 9/00; G03F 9/7003; G03F 9/7007; G03F 9/7011; G03F 9/7019; G03F 9/7023; G03F 9/7038; G03F 9/7042; G03F 9/7046; G03F 9/7065; G03F 9/7069; G03F 9/7073; G03F 9/7076; G03F 9/708; G03F 9/7084; G03F 9/7088; G03F 9/7092; B29C 43/58; B29C 43/52; B29C 2043/5833; B29C 2035/0827; B29C 35/0805; G01B 11/14; G01B 11/00; G02B 27/141
    See application file for complete search history.

(56) References Cited

U.S. PATENT DOCUMENTS

| | | |
|---|---|---|
| 5,772,905 A | 6/1998 | Chou |
| 6,632,585 B1 | 10/2003 | Nakamura |
| 6,909,998 B2 | 6/2005 | Hocheng et al. |
| 7,197,176 B2 | 3/2007 | Fukui et al. |
| 7,322,287 B2 | 1/2008 | Tan et al. |
| 2004/0021866 A1 | 2/2004 | Watts et al. |
| 2004/0022888 A1* | 2/2004 | Sreenivasan .......... G03F 7/0002 425/174.4 |
| 2005/0270516 A1 | 12/2005 | Cherala et al. |
| 2009/0108483 A1 | 4/2009 | Suehira et al. |
| 2009/0170038 A1 | 7/2009 | Amako et al. |
| 2009/0296058 A1 | 12/2009 | Slotboom et al. |
| 2011/0206852 A1 | 8/2011 | Shiode |
| 2011/0273684 A1* | 11/2011 | Owa .................... B29C 43/003 355/53 |
| 2011/0278768 A1* | 11/2011 | Sato .................... G03F 9/7076 264/406 |
| 2013/0093113 A1 | 4/2013 | Hayashi et al. |
| 2013/0112097 A1 | 5/2013 | Nakagawa et al. |
| 2015/0013559 A1 | 1/2015 | Hayashi |

FOREIGN PATENT DOCUMENTS

| | | |
|---|---|---|
| JP | 2004259985 A | 9/2004 |
| KR | 1020130040727 A | 4/2013 |
| KR | 1020130130629 A | 12/2013 |
| WO | 2013136733 A1 | 9/2013 |

OTHER PUBLICATIONS

Written Opinion issued in Intl. Appln. No. PCT/JP2015/051950 dated Apr. 14, 2015.
Office Action issued in Korean Patent Application No. 10-2016-7022260 dated Jul. 5, 2017.
Office Action issued in Chinese Application No. 201580005034.2 dated Feb. 27, 2018. English translation provided.
Office Action issued in U.S. Appl. No. 15/100,666 dated Aug. 6, 2018.
Notice of Allowance issued in U.S. Appl. No. 15/100,666 dated Feb. 7, 2019.

\* cited by examiner

NON-MEASUREMENT DIRECTION

IMPRINT APPARATUS AND METHOD OF MANUFACTURING ARTICLE

TECHNICAL FIELD

The present invention relates to an imprint apparatus and a method of manufacturing an article.

BACKGROUND ART

An imprint apparatus that molds an imprint material on a substrate by using a mold has received attention as one of mass production lithography apparatuses for magnetic storage media, semiconductor devices, and the like. The imprint apparatus can form a pattern on a substrate by curing an imprint material in a state in which the imprint material supplied onto the substrate contacts the mold, and separating (releasing) the mold from the cured imprint material.

In the manufacture of semiconductor devices and the like, the pattern region of a mold needs to be aligned with high accuracy with a shot region formed on a substrate and transferred to the shot region. Japanese Patent Laid-Open No. 2004-259985 proposes a method of irradiating a substrate with light to heat the substrate and deform a shot region on the substrate, and aligning the substrate and a mold.

The imprint apparatus disclosed in Japanese Patent Laid-Open No. 2004-259985 includes a detection unit that irradiates with light a mark arranged on a mold and a mark arranged on a substrate, and detects a position deviation between these marks based on the reflected light. According to Japanese Patent Laid-Open No. 2004-259985, the detection unit detects a position deviation between the marks, and then the mold and the substrate are aligned based on the detected position deviation. However, in the method of aligning a mold and a substrate after detecting a position deviation between marks by the detection unit, it may be difficult to align the mold and the substrate with high accuracy because the position deviation between the marks may occur even during alignment.

SUMMARY OF INVENTION

The present invention provides, for example, an imprint apparatus advantageous for aligning a substrate and a mold with high accuracy.

According to one aspect of the present invention, there is provided an imprint apparatus that molds an imprint material on a shot region of a substrate by using a mold on which a pattern is formed, comprising: a detection unit configured to irradiate a first mark of the mold and a second mark of the substrate with first light, detect the first light from the first mark and the second mark, and measure a position deviation between the first mark and the second mark; a heating unit configured to irradiate the substrate via the mold with second light for heating, and heat the substrate to deform the shot region; and a control unit configured to control alignment between the mold and the substrate based on the position deviation, wherein a parameter of the detection unit, a parameter of the heating unit, or parameters of the detection unit and the heating unit is/are set not to detect, by the detection unit, the second light reflected by at least one of the mold and the substrate while the first light from the first mark and the second mark is detected by using the detection unit, and the substrate is irradiated with the second light and heated by using the heating unit.

Further features of the present invention will become apparent from the following description of exemplary embodiments with reference to the attached drawings.

DESCRIPTION OF EMBODIMENTS

Figure 1:
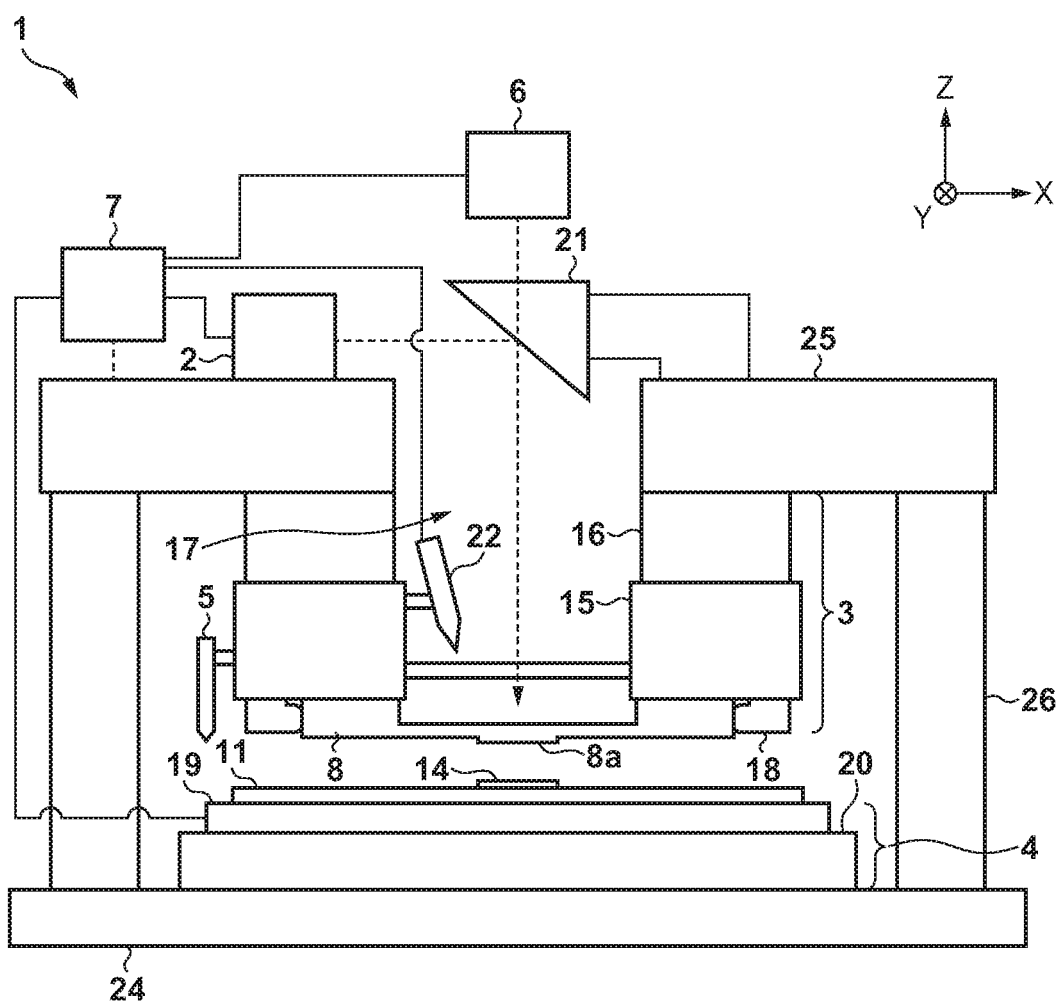
FIG. 1 is a schematic view showing an imprint apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An imprint apparatus 1 according to the first embodiment of the present invention will be described with reference to FIG. 1. The imprint apparatus 1 is used to manufacture a semiconductor device or the like. The imprint apparatus 1 performs an imprint process of forming a pattern on a substrate 11 by molding an imprint material on the shot region of the substrate 11 by using a mold 8. For example, the imprint apparatus 1 cures the imprint material in a state in which the mold 8 on which a pattern is formed contacts the imprint material (resin) on the substrate. Then, the imprint apparatus 1 widens the interval between the mold 8 and the substrate 11, separates (releases) the mold 8 from the cured imprint material, and thus can form the pattern on the substrate. Methods of curing an imprint material include a heat cycle method using heat and a photo-curing method using light. The imprint apparatus 1 according to the first embodiment adopts the photo-curing method. The photo-curing method is a method of supplying an uncured ultraviolet-curing resin (to be referred to as a resin 14 hereinafter) as the imprint material onto a substrate, and irradiating the resin 14 with ultraviolet rays in a state in which the mold 8 and the resin 14 contact each other, thereby curing the resin 14. After the resin 14 is cured by irradiation with ultraviolet rays, the mold 8 is separated from the resin 14, and the pattern can be formed on the substrate.

[Configuration of Imprint Apparatus]

FIG. 1 is a schematic view showing the imprint apparatus 1 according to the first embodiment. The imprint apparatus 1 can include a mold stage 3 that holds the mold 8, a substrate stage 4 that holds the substrate 11, a curing unit 2, a heating unit 6, a detection unit 22, and a resin supply unit 5. The mold stage 3 is fixed to a bridge plate 25 supported by a base plate 24 via a column 26. The substrate stage 4 is fixed to the base plate 24. The imprint apparatus 1 includes a control unit 7 that includes, for example, a CPU and a memory and controls the imprint process (controls each unit of the imprint apparatus 1).

The mold 8 is generally made of a material capable of transmitting ultraviolet rays, such as quartz. A three-dimensional pattern to be transferred to the substrate 11 is formed in a partial region (pattern region 8a) on the substrate-side surface. The substrate 11 can be, for example, a single-crystal silicon substrate or an SOI (Silicon On Insulator) substrate. The resin supply unit 5 (to be described later) supplies the resin 14 (ultraviolet-curing resin) onto the upper surface (surface to be processed) of the substrate 11.

The mold stage 3 includes a mold holding unit 15 that holds the mold 8 by a vacuum chuck force, an electrostatic force, or the like, and a mold driving unit 16 that drives the mold holding unit 15 in the Z direction. The mold holding unit 15 and the mold driving unit 16 have an opening region 17 at their center portions (insides), and are configured to irradiate the substrate 11 via the mold 8 with light emitted by the curing unit 2 or the heating unit 6. A deformation including a component such as a magnification component or a trapezoidal component is sometimes generated in the mold 8 owing to a manufacturing error, thermal deformation, or the like. To cancel this, the mold stage 3 may include a deformation unit 18 that deforms the pattern region 8a by adding a force to a plurality of portions on the side surface of the mold 8. For example, the deformation unit 18 can include a plurality of actuators arranged to add a force to a plurality of portions on the respective side surfaces of the mold 8. The pattern region 8a of the mold 8 can be deformed into a desired shape by individually adding a force to the plurality of portions on the respective side surfaces of the mold 8 by the plurality of actuators. The actuator of the deformation unit 18 is, for example, a linear motor, an air cylinder, or a piezoelectric actuator.

The mold driving unit 16 includes an actuator such as a linear motor or an air cylinder, and drives the mold holding unit 15 (mold 8) in the Z direction so as to bring the pattern region 8a of the mold 8 into contact with the resin 14 on the substrate or separate it from the resin 14 on the substrate. Since high-accuracy alignment is requested of the mold driving unit 16 when bringing the mold 8 and the resin 14 on the substrate into contact with each other, the mold driving unit 16 may be constituted by a plurality of driving systems such as a coarse driving system and a fine driving system. The mold driving unit 16 may have, for example, a position adjustment function of not only driving the mold 8 in the Z direction but also adjusting the position of the mold 8 in the X and Y directions and the θ direction (rotational direction around the Z-axis), and a tilt function of correcting the tilt of the mold 8. In the imprint apparatus 1 according to the first embodiment, the mold driving unit 16 performs an operation of changing the distance between the substrate 11 and the mold 8. However, the substrate driving unit 20 of the substrate stage 4 may perform this operation, or both of the substrate driving unit 20 and the mold driving unit 16 may perform this operation.

The substrate stage 4 includes a substrate holding unit 19 and a substrate driving unit 20. When bringing the pattern region 8a of the mold 8 and the resin 14 on the substrate into contact with each other, the substrate stage 4 moves the substrate 11 in the X and Y directions and aligns the mold 8 and the substrate 11. The substrate holding unit 19 holds the substrate 11 by a vacuum chuck force, an electrostatic force, or the like. The substrate driving unit 20 mechanically holds the substrate holding unit 19, and drives the substrate holding unit 19 (substrate 11) in the X and Y directions. The substrate driving unit 20 may use, for example, a linear motor and may be constituted by a plurality of driving systems such as a coarse driving system and a fine driving system. The substrate driving unit 20 may have, for example, a driving function of driving the substrate 11 in the Z direction, a position adjustment function of rotating and driving the substrate 11 in the θ direction to adjust the position of the substrate 11, and a tilt function of correcting the tilt of the substrate 11.

Figure 2A:
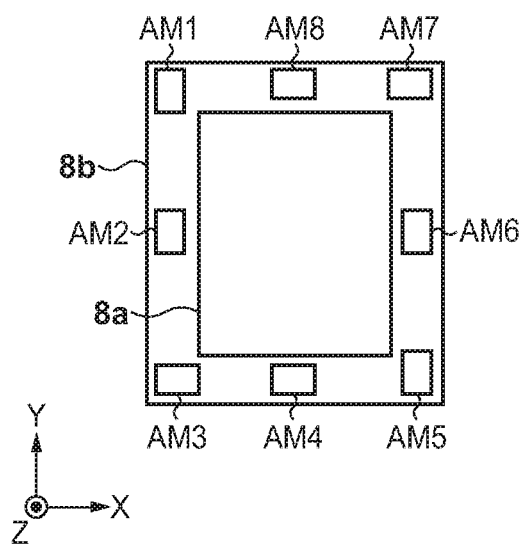
FIG. 2A is a view for explaining an example of the arrangement of marks of a mold.
Figure 2B:
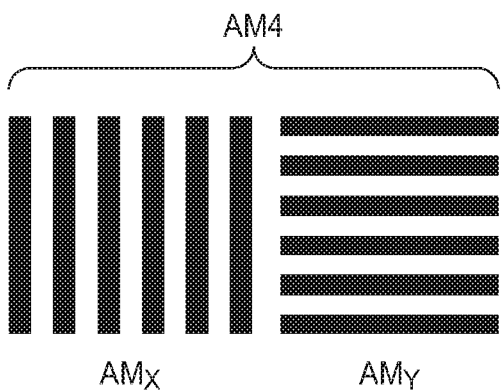
FIG. 2B is a view for explaining the mark of the mold.
Figure 2C:
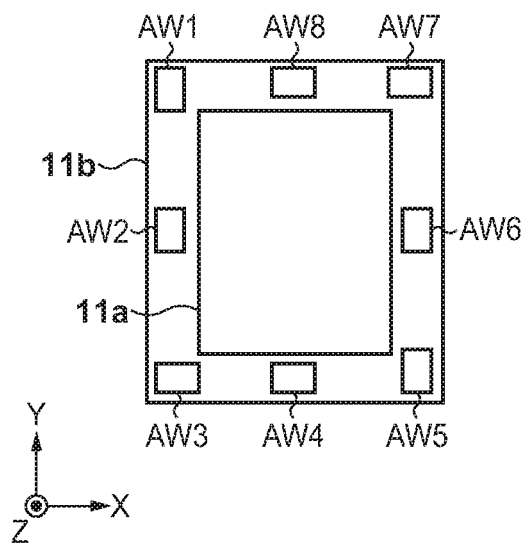
FIG. 2C is a view for explaining an example of the arrangement of marks of a substrate.
Figure 2D:
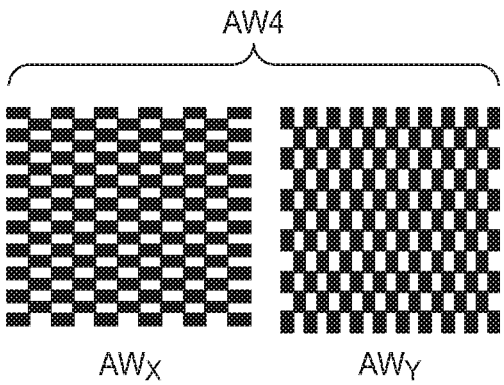
FIG. 2D is a view for explaining the mark of the substrate.

The detection unit 22 detects position deviations (X and Y directions) between marks AM (first marks) arranged on the mold 8 and marks AW (second marks) arranged on the substrate 11. The detection unit 22 can include an emitting unit 22a that emits light to irradiate the marks AM of the mold 8 and the marks AW of the substrate 11, and a light receiving unit 22b that receives the light diffracted by these marks. The marks AM of the mold 8 are arranged at a plurality of portions in the pattern region 8a of the mold 8. The marks AW of the substrate are arranged at a plurality of portions in a shot region 11a on the substrate. For example, the marks AW of the substrate 11 are arranged on a scribe line 11b provided outside the shot region 11a, as shown in FIG. 2C. The marks AM of the mold 8 are arranged in a region 8b outside the pattern region 8a in correspondence with the marks AW of the substrate 11, as shown in FIG. 2A. The marks AM of the mold 8 and the marks AW of the substrate 11 are arranged so that they are overlaid when the pattern region 8a and the shot region 11a are made to coincide with each other in the X and Y directions. The detection unit 22 detects a position deviation between the mark AM of the mold 8 and the mark AW of the substrate 11 at each portion. As a result, the shape difference between the pattern region 8a and the shot region 11a can be acquired. Details of the configuration of the detection unit 22 will be described later.

An example of the arrangement of the marks AM of the mold 8 and the marks AW of the substrate 11 will be explained with reference to FIGS. 2A to 2D. For example, eight marks AM1 to AM8 are formed in the region 8b (region corresponding to the scribe line 11b of the substrate 11) outside the pattern region 8a on the mold 8, as shown in FIG. 2A. Each of the marks AM1 to AM8 includes an X-direction measurement mark $AM_X$ and Y-direction measurement mark $AM_Y$ that are constituted by line-and-space diffraction gratings, like the structure of the mark AM4 shown in FIG. 2B. The mark AM1 (AM2), mark AM3 (AM4), mark AM5 (AM6), and mark AM7 (AM8) are arranged so that the structures of the marks AM are rotated by 90° in order. Similarly, eight marks AW1 to AW8 are formed on the scribe line 11b provided outside the shot region 11a on the substrate 11, as shown in FIG. 2C. Each of the marks AW1 to AW8 includes an X-direction measurement mark $AW_X$ and Y-direction measurement mark $AW_Y$ that are constituted by checkerboard diffraction gratings, like the structure of the mark AW4 shown in FIG. 2D. The mark AW1 (AW2), mark AW3 (AW4), mark AW5 (AW6), and mark AW7 (AW8) are arranged so that the structures of the marks AW are rotated by 90° in order.

The diffraction grating on the mark AM of the mold 8 and the diffraction grating on the mark AW of the substrate 11 are constituted to have slightly different pitches in the measurement direction. Light that has been reflected by the mark AM of the mold 8 and the mark AW of the substrate 11 and has been incident on the light receiving unit 22b generates, on an image sensor, an interference fringe (moire fringe) corresponding to the pitch difference between the diffraction grating on the mark AM of the mold 8 and the diffraction grating on the mark AW of the substrate 11. An image sensor 224 senses this moire fringe and performs an image process, and the position deviation between the mark AM of the mold 8 and the mark AW of the substrate 11 can be detected. By detecting such position deviations for the respective marks, the shape difference between the pattern region 8a and the shot region 11a can be acquired. The marks AM of the mold 8 and the marks AW of the substrate 11 may be arranged not only at respective vertices in the pattern region 8a of the mold 8 and the shot region 11a of the substrate 11 but also on respective sides. In the example shown in FIGS. 2A to 2D, the X measurement marks and the Y measurement marks are arranged at a plurality of portions (eight portions) in each of the pattern region 8a of the mold 8 and the shot region 11a of the substrate 11. Thus, even a high-order component such as an arcuate component or a barrel component can be acquired from the shape difference between the pattern region 8a and the shot region 11a, in addition to a shift component, a magnification component, a rotation component, and trapezoidal components (X and Y directions).

In the above-described example, a line-and-space diffraction grating is formed for the mark AM of the mold 8, and a checkerboard diffraction grating is formed for the mark AW of the substrate 11. However, the marks are not limited to them. For example, a checkerboard diffraction grating may be formed for the mark AM of the mold 8, and a line-and-space diffraction grating may be formed for the mark AW of the substrate 11. A case in which a checkerboard diffraction grating is formed for the mark AW of the substrate 11 will be described below.

The resin supply unit 5 supplies (applies) the resin 14 (uncured region) onto the substrate. As described above, the imprint apparatus 1 according to the first embodiment uses, as the imprint material, an ultraviolet-curing resin having a property in which the resin is cured by irradiation with ultraviolet rays. However, the present invention is not limited to this, and the resin 14 (imprint material) supplied from the resin supply unit 5 to the substrate 11 can be appropriately selected in accordance with various conditions in semiconductor device manufacturing steps. The amount of resin discharged from the resin supply unit 5 can be appropriately decided in consideration of the thickness and density of a pattern formed on the resin 14 on the substrate, and the like. The mold 8 and the resin 14 desirably contact each other for a predetermined time in order to satisfactorily fill a three-dimensional pattern formed in the pattern region 8a of the mold 8 with the resin 14 supplied onto the substrate.

At the time of the imprint process, the curing unit 2 cures the resin 14 by irradiating, with light (ultraviolet rays), the resin 14 supplied to the shot region 11a on the substrate. The curing unit 2 can include, for example, a light source that emits light (ultraviolet rays) for curing the resin 14, and an optical element for adjusting light emitted by the light source into light appropriate for the imprint process. Since the first embodiment adopts the photo-curing method, the curing unit 2 includes the light source for emitting ultraviolet rays. However, for example, when a heat-curing method is adopted, the curing unit 2 can include a heat source for curing a heat-curing resin serving as the imprint material.

The substrate 11 to undergo the imprint process by the imprint apparatus 1 is loaded into the imprint apparatus 1 after a heating step in a deposition step such as a step of sputtering in a series of semiconductor device manufacturing steps. In some cases, a deformation including a component such as a magnification component, a trapezoidal component, an arcuate component, or a barrel component is generated in the shot region 11a on the substrate. In this case, it may be difficult to implement high-accuracy alignment between the pattern region 8a and the shot region 11a by only deforming the pattern region 8a of the mold 8 by the deformation unit 18 of the mold stage 3. Therefore, the shot region 11a on the substrate may be deformed in conformity with the shape of the pattern region 8a of the mold 8 deformed by the deformation unit 18. To do this, the imprint apparatus 1 according to the first embodiment includes the heating unit 6 that deforms the shot region 11a by irradiating the substrate 11 with light and heating it.

The heating unit 6 can include a light source that emits light for heating the substrate 11, and an adjustment unit that adjusts the intensity of light irradiating the substrate 11 from the light source. The light source of the heating unit 6 emits light having a wavelength suitable for heating the substrate 11 without curing the resin 14 supplied onto the substrate. For example, a light source that emits light having a wavelength of 400 nm or more may be used as the light source of the heating unit 6. The adjustment unit adjusts the intensity of light irradiating the substrate 11 so that the temperature distribution in the shot region 11a becomes a desired one. As the adjustment unit, for example, a liquid crystal device or a digital mirror device (DMD) is available. The liquid crystal device can change the intensity of light irradiating the substrate 11 by arranging a plurality of liquid crystal elements on the light transmitting surface, and individually controlling voltages applied to the respective liquid crystal elements. The digital mirror device can change the intensity of light irradiating the substrate 11 by arranging a plurality of mirror elements on the light reflecting surface, and individually adjusting the surface directions of the respective mirror elements.

Here, the imprint apparatus 1 according to the first embodiment is constituted such that light emitted by the curing unit 2 is reflected by an optical element 21 and irradiates the substrate 11, and light emitted by the heating unit 6 passes through the optical element 21 and irradiates the substrate 11. However, the imprint apparatus 1 is not limited to this. For example, the imprint apparatus 1 may be constituted such that light emitted by the heating unit 6 is reflected by the optical element 21 and irradiates the substrate 11, and light emitted by the curing unit 2 passes through the optical element 21 and irradiates the substrate 11. The optical element 21 can be, for example, a beam splitter (for example, a dichroic mirror) having a characteristic of transmitting light having one of two different wavelengths and reflecting light having the other wavelength.

Figure 3A:
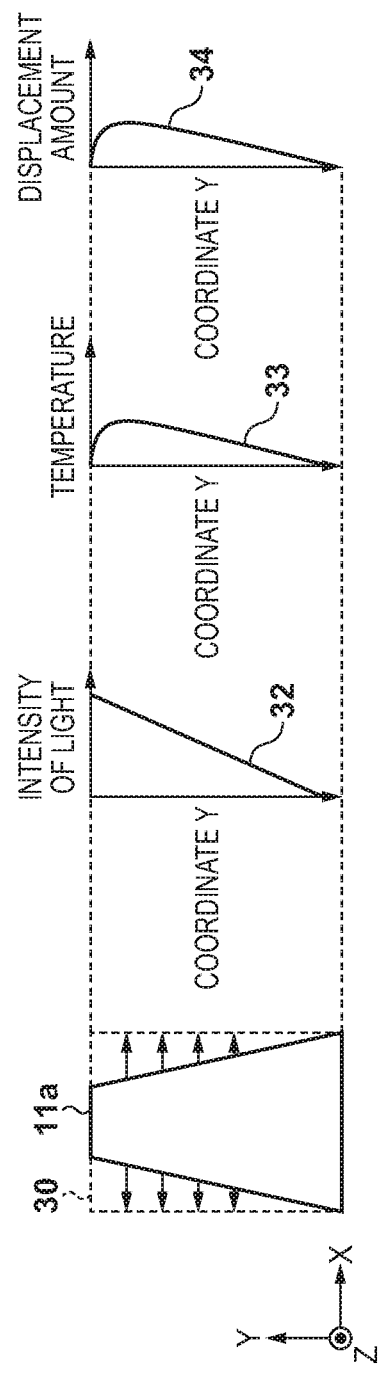
FIG. 3A is a view for explaining an example of correcting the shape of a shot region by a heating unit.
Figure 3B:
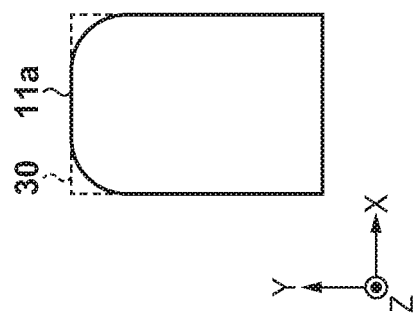
FIG. 3B is a view for explaining the example of correcting the shape of the shot region by the heating unit.

Next, an example in which the heating unit 6 corrects the shape of the shot region 11a suffering a deformation including a trapezoidal component will be explained with reference to FIGS. 3A and 3B. When the shape of the shot region 11a suffering a deformation including a trapezoidal component is corrected into a target shape 30, as shown in FIG. 3A, the control unit 7 controls the heating unit 6 (adjustment unit) so that the intensity of light emitted by the heating unit 6 increases linearly in the Y direction. When the shot region 11a is irradiated with light emitted by the heating unit 6 with such a light intensity distribution 32, a temperature distribution 33 shown in FIG. 3A can be formed in the shot region 11a, and the shot region 11a can be deformed by a displacement amount 34 shown in FIG. 3A. As a result, the shape of the shot region 11a can come close to the target shape 30, as shown in FIG. 3B.

Figure 4:
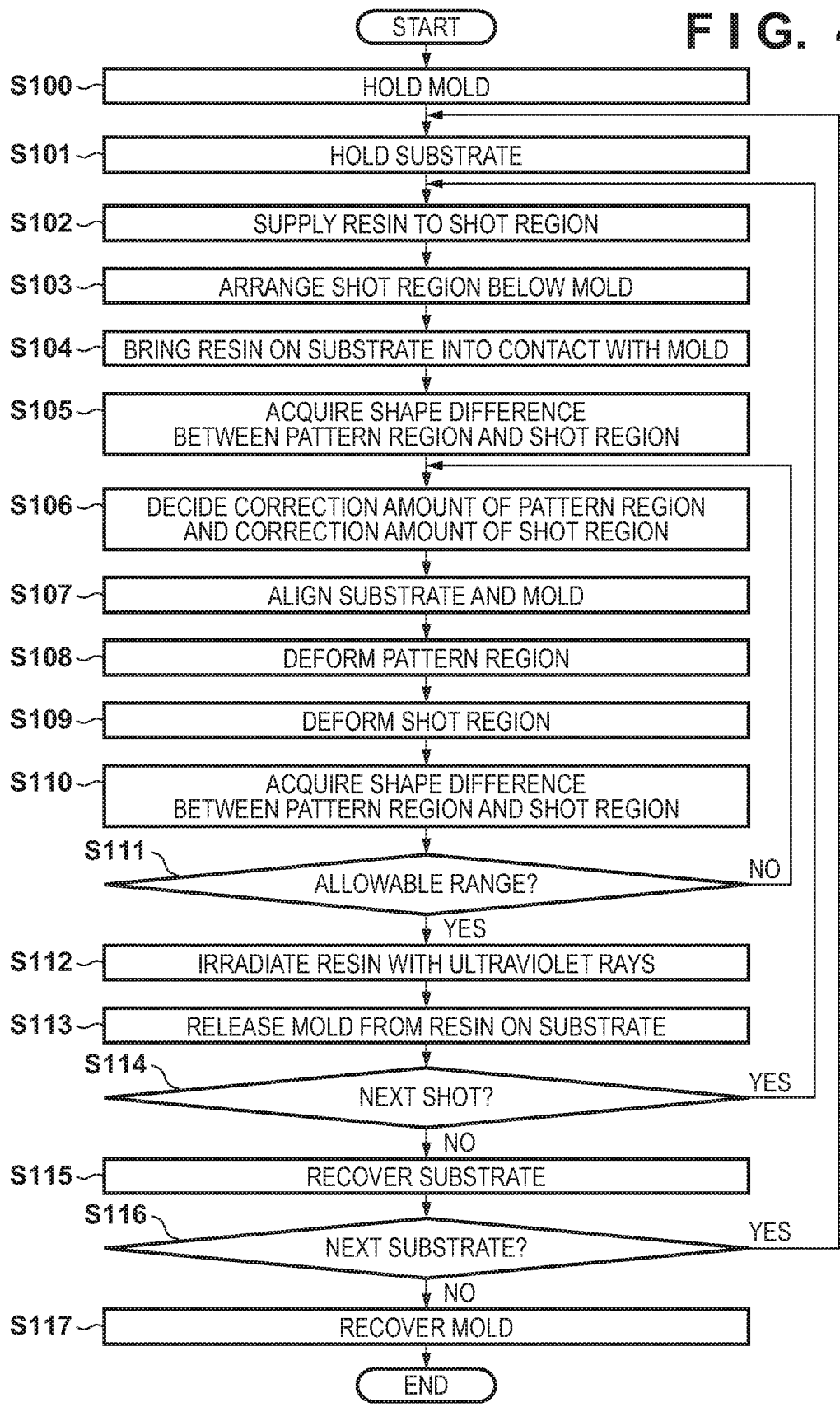
FIG. 4 is a flowchart showing an operation sequence in an imprint process.

The imprint process of transferring the pattern of the mold 8 to the shot region 11a of the substrate 11 in the imprint apparatus 1 having this configuration according to the first embodiment will be explained with reference to FIG. 4. FIG. 4 is a flowchart showing an operation sequence in the imprint process of transferring the pattern of the mold 8 to the shot region 11a of the substrate 11.

In step S100, the control unit 7 controls a mold transport mechanism (not shown) to transport the mold 8 to below the mold holding unit 15, and controls the mold holding unit 15 to hold the mold 8. Accordingly, the mold 8 is arranged inside the imprint apparatus 1. In step S101, the control unit 7 controls a substrate transport mechanism (not shown) to transport the substrate 11 onto the substrate holding unit 19, and controls the substrate holding unit 19 to hold the substrate 11. The substrate 11 is therefore arranged inside the imprint apparatus 1. In step S102, the control unit 7 controls the resin supply unit 5 to supply the resin 14 (ultraviolet-curing resin) to the shot region 11a to undergo the imprint process. In step S103, the control unit 7 controls the substrate driving unit 20 to move the substrate 11 so that the shot region 11a where the resin 14 has been supplied is arranged below the pattern region 8a of the mold 8. In step S104, the control unit 7 controls the mold driving unit 16 to bring the pattern region 8a of the mold 8 and the resin 14 on the substrate into contact with each other, that is, shorten the distance between the mold 8 and the substrate 11.

In step S105, the control unit 7 controls the detection unit 22 to detect a position deviation between the mark AM (first mark) of the mold 8 and the mark AW (second mark) of the substrate 11 in the state in which the mold 8 and the resin 14 on the substrate contact each other. Based on the detection result from the detection unit 22, the control unit 7 can acquire the shape difference between the pattern region 8a of the mold 8 and the shot region 11a of the substrate 11. In step S106, the control unit 7 decides, based on the acquired shape difference, the correction amount of the pattern region 8a and that of the shot region 11a so that the shape of the pattern region 8a of the mold 8 coincides with that of the shot region 11a of the substrate 11.

In step S107, the control unit 7 controls the substrate driving unit 20 to move the substrate 11 based on the shape difference acquired in step S106, and align the mold 8 and the substrate 11. The alignment in step S107 is to correct a translation shift component and a rotation component out of the shape difference between the pattern region 8a of the mold 8 and the shot region 11a of the substrate 11. This shape difference can include deformation components such as a magnification component and a trapezoidal component, as described above, in addition to the translation shift component and the rotation component. Deformation components such as a magnification component and a trapezoidal component can be corrected in steps S108 and S109. In step S108, the control unit 7 controls the deformation unit 18 to deform the pattern region 8a by adding a force to a plurality of portions on the side surface of the mold 8 based on the correction amount of the pattern region 8a that has been decided in step S106. In step S109, the control unit 7 controls the heating unit 6 to irradiate the substrate 11 with light, give a temperature distribution to the shot region 11a, and deform the shot region 11a based on the correction amount of the shot region 11a that has been decided in step S106. By steps S108 and S109, the shape difference between the pattern region 8a of the mold 8 and the shot region 11a of the substrate 11 can be made to fall within an allowable range, and the pattern of the mold 8 can be transferred to the shot region 11a with high accuracy.

In step S110, the control unit 7 controls the detection unit 22 to detect a position deviation between the mark AM of the mold 8 and the mark AW of the substrate 11. Based on the detection result from the detection unit 22, the control unit 7 can acquire the shape difference between the pattern region 8a of the mold 8 and the shot region 11a of the substrate 11. In step S111, the control unit 7 determines whether the shape difference acquired in step S110 falls within the allowable range. If the shape difference acquired in step S110 does not fall within the allowable range, the process returns to step S106, and the control unit 7 decides again the correction amount of the pattern region 8a and that of the shot region 11a based on this shape difference. If the shape difference acquired in step S110 falls within the allowable range, the process returns to step S112.

In step S112, the control unit 7 controls the curing unit 2 to irradiate, with ultraviolet rays, the resin 14 in contact with the pattern region 8a of the mold 8, and cure the resin 14. In step S113, the control unit 7 controls the mold driving unit 16 to separate (release) the pattern region 8a of the mold 8 from the resin 14 on the substrate, that is, increase the distance between the mold 8 and the substrate 11. In step S114, the control unit 7 determines whether a shot region 11a (next shot region 11a) where the pattern of the mold 8 will be transferred subsequently remains on the substrate. If there is the next shot region 11a, the process returns to step S102. If there is no next shot region 11a, the process advances to step S115. In step S115, the control unit 7 controls the substrate transport mechanism (not shown) to recover the substrate 11 from the substrate holding unit 19. In step S116, the control unit 7 determines whether there is a substrate 11 (next substrate 11) to subsequently undergo the imprint process. If there is the next substrate 11, the process returns to step S101. If there is no next substrate 11, the process advances to step S117. In step S117, the control unit 7 controls the mold transport mechanism (not shown) to recover the mold 8 from the mold holding unit 15.

[Configurations of Detection Unit and Heating Unit]

In the imprint apparatus 1 having the above-described configuration according to the first embodiment, steps S106 to S109 are repeated until the shape difference between the pattern region 8a and the shot region 11a falls within the allowable range, in order to improve the alignment accuracy between the mold 8 and the substrate 11. At this time, the substrate 11 may be irradiated with light by the heating unit 6 and the shot region 11a may be deformed while acquiring the shape difference between the pattern region 8a and the shot region 11a. That is, the substrate 11 may be irradiated with light by the heating unit 6 and the shot region 11a may be deformed while detecting the mark AM (first mark) of the mold 8 and the mark AW (second mark) of the substrate 11 by the detection unit 22. However, in this alignment method, light for heating (to be referred to as second light hereinafter) emitted by the heating unit 6 may be reflected by the mark AM of the mold 8 or the mark AW of the substrate 11 and be incident on the detection unit 22. In this case, the second light which is incident on the image sensor 224 of the detection unit 22 (light receiving unit 22b) acts as a noise component, and the position deviation detection accuracy may decrease. Also, when the second light from the heating unit 6 is incident on the detection unit 22, exceeds the intensity level of light detectable by the image sensor 224 of the detection unit 22 (light receiving unit 22b), and is saturated, the position deviation detection accuracy may decrease. As a method of preventing the decrease in position deviation detection accuracy, there is a method of stopping irradiation of substrate 11 with light by the heating unit 6 when the detection unit 22 detects a position deviation between the mark AM of the mold 8 and the mark AW of the substrate 11 in step S110. In this method, however, heat applied to the substrate 11 transfers to the substrate holding unit 19, the mold 8 via the resin 14, and the like, and the shape difference between the pattern region 8a and the shot region 11a may gradually increase during the stop of irradiation of the substrate 11 with light by the heating unit 6. In other words, this method takes a long time for alignment between the mold 8 and the substrate 11, and cannot satisfactorily perform the alignment with high accuracy. In the imprint apparatus 1 according to the first embodiment, therefore, the detection unit 22 and the heating unit 6 are configured so that the intensity of the second light which is incident on the detection unit 22 becomes lower than the maximum intensity of the second light reflected by at least one of the mold 8 and substrate 11. More specifically, in the imprint apparatus 1, the detection unit 22 and the heating unit 6 are configured to suppress incidence of the second light reflected by at least one of the mold 8 and substrate 11 to the detection unit 22. The configurations of the heating unit 6 and detection unit 22 will be explained below.

Figure 5:
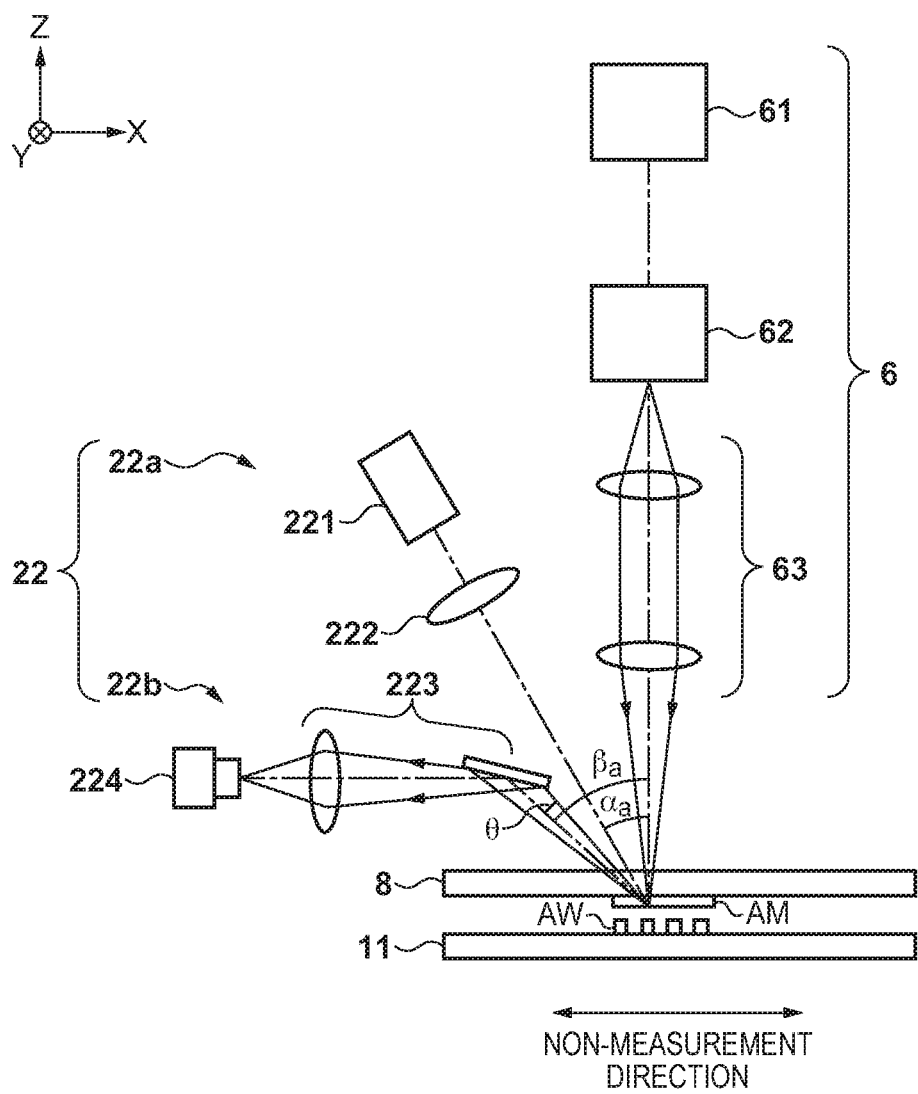
FIG. 5 is a view showing an example of the configurations of a heating unit and detection unit.

FIG. 5 is a view showing an example of the configurations of the heating unit 6 and detection unit 22. In FIG. 5, the heating unit 6 includes a light source 61, an adjustment unit 62, and an optical system 63. The detection unit 22 includes the emitting unit 22a that emits light (to be referred to as first light hereinafter) toward the mark AM of the mold 8 and the mark AW of the substrate 11, and the light receiving unit 22b that receives the first light reflected by the mark AM of the mold 8 and the mark AW of the substrate 11. The emitting unit 22a includes, for example, a light source 221 and an illumination optical system 222. The light receiving unit 22b includes, for example, a detection optical system 223 and the image sensor 224. The detection unit 22 irradiates the mark AM of the mold 8 and the mark AW of the substrate 11 with the first light emitted by the emitting unit 22a. The detection unit 22 observes, by the image sensor 224, an interference fringe generated by light diffracted by the mark AM of the mold 8 and light diffracted by the mark AW of the substrate 11. The detection unit 22 can detect a position deviation between the mark AM of the mold 8 and the mark AW of the substrate 11 based on a signal output from the image sensor 224. The mark AM of the mold 8 and the mark AW of the substrate 11 can include diffraction gratings. In the first embodiment, the mark AM of the mold 8 can include a line-and-space diffraction grating having a cycle in only the measurement direction. The mark AW of the substrate 11 can include a checkerboard diffraction grating having cycles respectively in the measurement direction and a direction perpendicular to it. The emitting unit 22a and the light receiving unit 22b are configured to incline the optical axis of the illumination optical system 222 and that of the detection optical system 223 in a direction (X direction in FIG. 5) perpendicular to the measurement direction with respect to a reference axis (Z-axis) perpendicular to the surface of the substrate 11. That is, the emitting unit 22a and the light receiving unit 22b are configured to perform oblique illumination on the mark AM of the mold 8 and the mark AW of the substrate 11.

Next, a method of configuring the heating unit 6 and the detection unit 22 to suppress incidence, to the light receiving unit 22b of the detection unit 22, of the second light that has been emitted by the heating unit 6 and diffracted (reflected) by at least one of the mold 8 and substrate 11 will be described. Hereinafter, a method of configuring the heating unit 6 and the detection unit 22 to suppress incidence, to the light receiving unit 22b, of the second light that has been emitted by the heating unit 6 and reflected by the substrate 11 will be explained. The same method can also be used as a method of configuring the heating unit 6 and the detection unit 22 to suppress incidence of the second light reflected by the mold 8 to the light receiving unit 22b.

In the imprint apparatus 1 according to the first embodiment, the parameter of the detection unit 22, the parameter of the heating unit 6, or the parameters of the detection unit 22 and the heating unit 6 is/are set to suppress incidence of the second light emitted by the heating unit 6 to the light receiving unit 22b of the detection unit 22. The parameter of the detection unit 22 is an element of the detection unit 22 that can be set when detecting a position deviation between the mark AM of the mold 8 and the mark AW of the substrate 11. At least one of the wavelength of the first light from the emitting unit 22a, the direction in which the emitting unit 22a emits the first light, the direction in which the light receiving unit 22b receives the first light, and the numerical aperture of the detection unit 22 (light receiving unit 22b) can be set as the parameter of the detection unit 22. The parameter of the heating unit 6 is an element of the heating unit 6 that can be set when irradiating the substrate 11 with the second light for heating the substrate 11. At least one of the wavelength of the second light from the heating unit 6, and the direction in which the second light from the heating unit is incident on the substrate 11 can be set as the parameter of the heating unit 6.

For example, the first light that has been emitted by the emitting unit 22a and reflected (diffracted) by the mark AW of the substrate 11 having a diffraction grating of a cycle $d_m$ in the non-measurement direction is incident on the light receiving unit 22b when equation (1) is satisfied:

$$d_m(\sin \alpha_a + \sin \beta_a) = m\lambda_a \quad (1)$$

where $\alpha_a$ is the angle between the reference axis (axis (Z-axis) perpendicular to the substrate surface) and the direction in which the emitting unit 22a emits the first light, $\beta_a$ is the angle between the reference axis and the direction in which the light receiving unit 22b receives the first light reflected by the mark AW of the substrate 11, $\lambda_a$ is the wavelength of the first light, and m is the diffraction order of light, diffracted by the mark AW of the substrate 11, of the first light emitted by the emitting unit 22a. When a halogen lamp or the like serving as a wide-band light source including many wavelengths is used as the light source that generates the first light, the wavelength $\lambda_a$ of the first light in equation (1) may be the central wavelength of the first light. The parameter of the detection unit 22 optimally satisfies equation (1), but is not limited to this as long as light is incident on the numerical aperture of the light receiving unit 22b.

To the contrary, the second light that has been emitted by the heating unit 6 and reflected (diffracted) by the mark AW of the substrate 11 is incident on the light receiving unit 22b when inequality (2) is satisfied:

$$d_m(\sin \alpha_h + \sin(\beta_a - \theta)) \leq n\lambda_h \leq d_m(\sin \alpha_h + \sin(\beta_a + \theta)) \quad (2)$$

More specifically, in order to suppress incidence, to the light receiving unit 22b, of the second light that has been emitted by the heating unit 6 and reflected by the mark AW of the substrate 11, inequality (3) obtained by inverting inequality signs in inequality (2) needs to be satisfied:

$$d_m(\sin \alpha_h + \sin(\beta_a - \theta)) > n\lambda_h \text{ or } d_m(\sin \alpha_h + \sin(\beta_a + \theta)) < n\lambda_h \quad (3)$$

In inequalities (2) and (3), $\alpha_h$ is the angle (in this embodiment, $\alpha_h = 0$) between the reference axis and the direction in which the second light from the heating unit 6 is incident on the substrate 11, $\sin \theta$ is the numerical aperture of the light receiving unit 22b, $\lambda_h$ is the wavelength of the second light, and n is the diffraction order of light, diffracted by the mark AW of the substrate 11, of the second light emitted by the heating unit 6. Note that the refractive index in the atmosphere in which the first light and the second light pass is set to be 1.

From this, the detection unit 22 and the heating unit 6 may be configured to satisfy equation (1) and inequality (3), in order to suppress incidence, to the light receiving unit 22b, of the second light that has been emitted by the heating unit 6 and reflected by the substrate 11 (mark AW). The imprint apparatus 1 according to the first embodiment can therefore prevent a decrease in detection accuracy caused by incidence of the second light emitted by the heating unit 6 to the light receiving unit 22b. The imprint apparatus 1 can deform the shot region 11a by irradiating the substrate 11 with the second light by the heating unit 6 while detecting a position deviation between the mark AM of the mold 8 and the mark AW of the substrate 11 by the detection unit 22. That is, the mold 8 and the substrate 11 can be overlaid with high accuracy.

Figure 6:
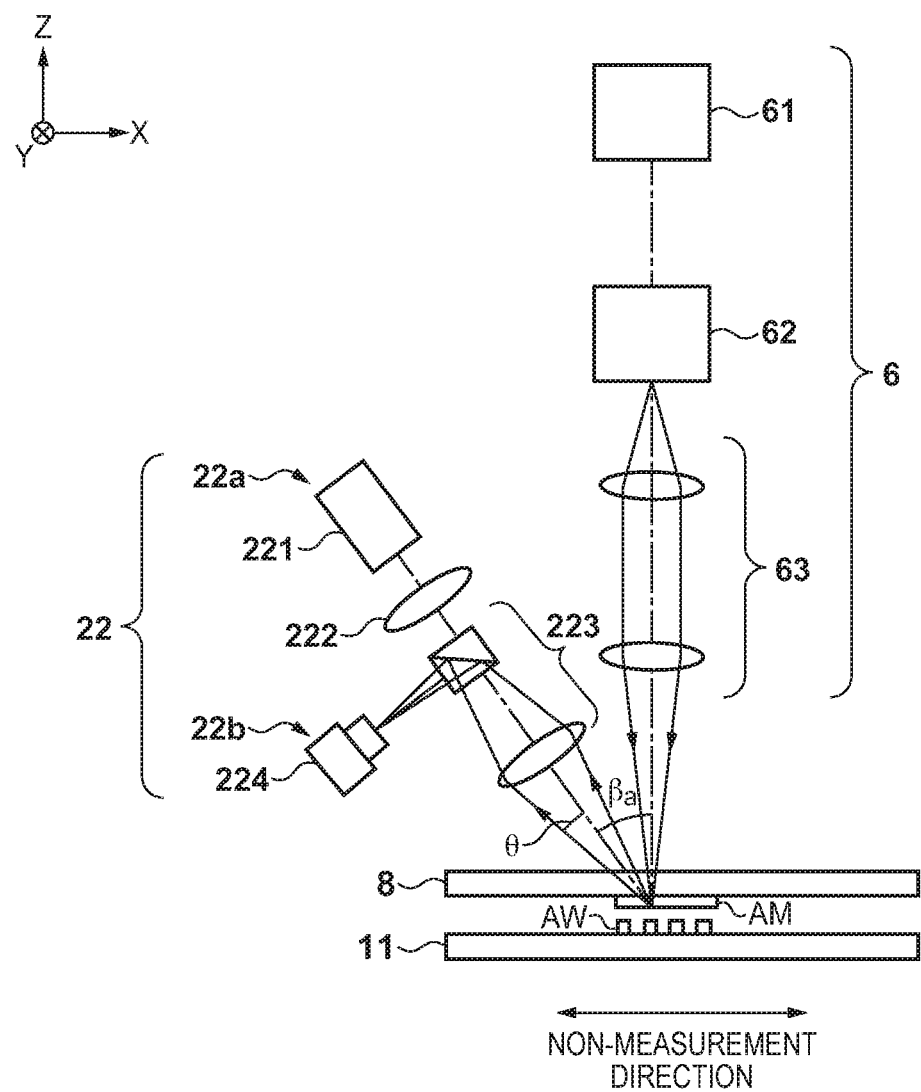
FIG. 6 is a view showing an example of the configurations of the heating unit and detection unit.

The detection unit 22 may be configured to include a common part between the optical path in the emitting unit 22a and the optical path in the light receiving unit 22b, as shown in FIG. 6. In this case, the angle $\alpha_a$ between the reference axis and the direction in which the emitting unit 22a emits the first light becomes equal to the angle $\beta_a$ between the reference axis and the direction in which the light receiving unit 22b receives the first light reflected by the mark AW of the substrate. Thus, equation (1) is rewritten into equation (4):

$$2d_m(\sin \beta_a) = m\lambda_a \quad (4)$$

In the configuration shown in FIG. 6, the detection unit 22 and the heating unit 6 may be configured to satisfy inequality (3) and equation (4), in order to suppress incidence, to the light receiving unit 22b, of the second light that has been emitted by the heating unit 6 and reflected by the mark AW of the substrate 11.

The cycle $d_m$ of the diffraction gratings on the mark AM of the mold 8 and the mark AW of the substrate 11 can be changed in accordance with the mark position deviation detection accuracy, the design of the circuit pattern, and the like. Hence, driving mechanisms that drive the detection unit 22 and the heating unit 6 may be arranged so that the exit angle and incident angle of the first light in the detection unit 22 and the exit angle of the second light in the heating unit 6 can be adjusted. Further, the detection unit 22 and the heating unit 6 may be configured so that the wavelength of the first light from the detection unit 22 and that of the second light from the heating unit 6 differ from each other.

The detection unit 22 and the heating unit 6 may use light sources capable of changing the wavelength, or wavelength filters may be inserted in the optical paths so that the wavelength of the first light from the detection unit 22 and that of the second light from the heating unit 6 can be adjusted.

[Configurations of Detection Unit and Curing Unit]

The influence of the curing unit 2 on the detection unit 22 will be explained. When irradiation of the resin 14 with ultraviolet rays by the curing unit 2 starts, the resin 14 starts curing, the stiffness of the resin 14 gradually rises, and the state between the substrate stage 4 and the mold 8 can be regarded as a state in which damping components are connected. In this state, the resin 14 has fluidity, so the mold 8 and the substrate 11 can relatively move. In addition, the shearing stress of the resin 14 acts between the mold 8 and the substrate 11, and a position deviation may be generated between the mold 8 and the substrate 11. To improve the overlay accuracy between the mold 8 and the substrate 11, the mold 8 and the substrate 11 may be aligned immediately before the resin 14 is cured while the shape difference between the pattern region 8a and the shot region 11a is acquired. In other words, the detection unit 22 may detect a position deviation between the mark AM (first mark) of the mold 8 and the mark AW (second mark) of the substrate 11 even while the curing unit 2 irradiates the resin 14 with ultraviolet rays. In this case, however, if light for curing (to be referred to as third light hereinafter) emitted by the curing unit 2 is reflected by the mold 8 or the substrate 11 and is incident on the detection unit 22, the third light which is incident on the detection unit 22 acts as a noise component, and the mark position deviation detection accuracy may decrease. Hence, in the imprint apparatus 1 according to the first embodiment, the detection unit 22 and the curing unit 2 are configured so that the intensity of the third light which is incident on the detection unit 22 becomes lower than the maximum intensity of the third light reflected by at least one of the mold 8 and substrate 11. More specifically, in the imprint apparatus 1, the detection unit 22 and the curing unit 2 are configured to suppress incidence of the third light reflected by at least one of the mold 8 and substrate 11 to the detection unit 22.

Next, a method of configuring the curing unit 2 and the detection unit 22 to suppress incidence, to the light receiving unit 22b of the detection unit 22, of the third light that has been emitted by the curing unit 2 and reflected by at least one of the mold 8 and substrate 11 will be described. Hereinafter, a method of configuring the curing unit 2 and the detection unit 22 to suppress incidence, to the light receiving unit 22b, of the third light that has been emitted by the curing unit 2 and reflected by the substrate 11 will be explained. The same method can also be used as a method of configuring the curing unit 2 and the detection unit 22 to suppress incidence of the third light reflected by the mold 8 to the light receiving unit 22b.

In the imprint apparatus 1 according to the first embodiment, the parameter of the detection unit 22, or the parameter of the curing unit 2, or the parameters of the detection unit 22 and the curing unit 2 is/are set to suppress incidence of the third light emitted by the curing unit 2 to the light receiving unit 22b of the detection unit 22. The parameter of the detection unit 22 is an element of the detection unit 22 that can be set when detecting a position deviation between the mark AM of the mold 8 and the mark AW of the substrate 11, as described above. At least one of the wavelength of the first light from the emitting unit 22a, the direction in which the emitting unit 22a emits the first light, the direction in which the light receiving unit 22b receives the first light, and the numerical aperture of the detection unit 22 (light receiving unit 22b) can be set as the parameter of the detection unit 22. The parameter of the curing unit 2 is an element of the curing unit 2 that can be set when irradiating the resin 14 with the third light for curing the resin 14. At least one of the wavelength of the third light from the curing unit 2, and the direction in which the third light from the curing unit 2 is incident on the resin 14 can be set as the parameter of the curing unit 2.

For example, when the detection unit 22 is configured as shown in FIG. 5, the first light that has been emitted by the emitting unit 22a and reflected (diffracted) by the mark AW of the substrate 11 having the diffraction grating of the cycle $d_m$ in the non-measurement direction is incident on the light receiving unit 22b when equation (1) is satisfied. To the contrary, the third light that has been emitted by the curing unit 2 and reflected (diffracted) by the mark AW of the substrate 11 is incident on the light receiving unit 22b when inequality (5) is satisfied:

$$d_m(\sin \alpha_e + \sin(\beta_a - \theta)) \leq n\lambda_e \leq d_m(\sin \alpha_e + \sin(\beta_a + \theta)) \quad (5)$$

More specifically, in order to suppress incidence, to the light receiving unit 22b, of the third light that has been emitted by the curing unit 2 and reflected by the mark AW of the substrate 11, inequality (6) obtained by inverting inequality signs in inequality (5) needs to be satisfied:

$$d_m(\sin \alpha_e + \sin(\beta_a - \theta)) > n\lambda_e \text{ or } d_m(\sin \alpha_e + \sin(\beta_a + \theta)) < n\lambda_c \quad (6)$$

In inequalities (5) and (6), $\alpha_e$ is the angle between the reference axis and the direction in which the third light from the curing unit 2 is incident on the substrate 11, sine, is the numerical aperture of the light receiving unit 22b, $\lambda_e$ is the wavelength of the third light, and n is the diffraction order of light, diffracted by the mark AW of the substrate 11, of the third light emitted by the curing unit 2. Note that the refractive index in the atmosphere in which the first light and the third light pass is set to be 1.

From this, the detection unit 22 and the curing unit 2 may be configured to satisfy equation (1) and inequality (6), in order to suppress incidence, to the light receiving unit 22b, of the third light that has been emitted by the curing unit 2 and reflected by the substrate 11 (mark AW). When the optical path in the emitting unit 22a and the optical path in the light receiving unit 22b are configured to include a common part, as shown in FIG. 6, the detection unit 22 and the curing unit 2 may be configured to satisfy equation (4) and inequality (6). The imprint apparatus 1 according to the first embodiment can therefore prevent a decrease in detection accuracy caused by incidence of the third light emitted by the curing unit 2 to the light receiving unit 22b. The imprint apparatus 1 can cure the resin 14 by irradiating the resin 14 with the third light by the curing unit 2 while detecting a position deviation between the mark AM of the mold 8 and the mark AW of the substrate 11 by the detection unit 22. That is, the mold 8 and the substrate 11 can be aligned immediately before the resin 14 is cured.

A driving mechanism that drives the curing unit 2 may be arranged so that the exit angle of the third light in the curing unit 2 can be adjusted. In addition, the detection unit 22 and the curing unit 2 may be configured so that the wavelength of the first light from the detection unit 22 and that of the third light from the curing unit 2 differ from each other. The heating unit 6 and the curing unit 2 may be configured so that the wavelength of the second light from the heating unit 6 and that of the third light from the curing unit 2 differ from each other. The curing unit 2 may use a light source capable of changing the wavelength, or a wavelength filter may be inserted in the optical path so that the wavelength of the third light from the curing unit 2 can be adjusted.

Second Embodiment

Figure 7:
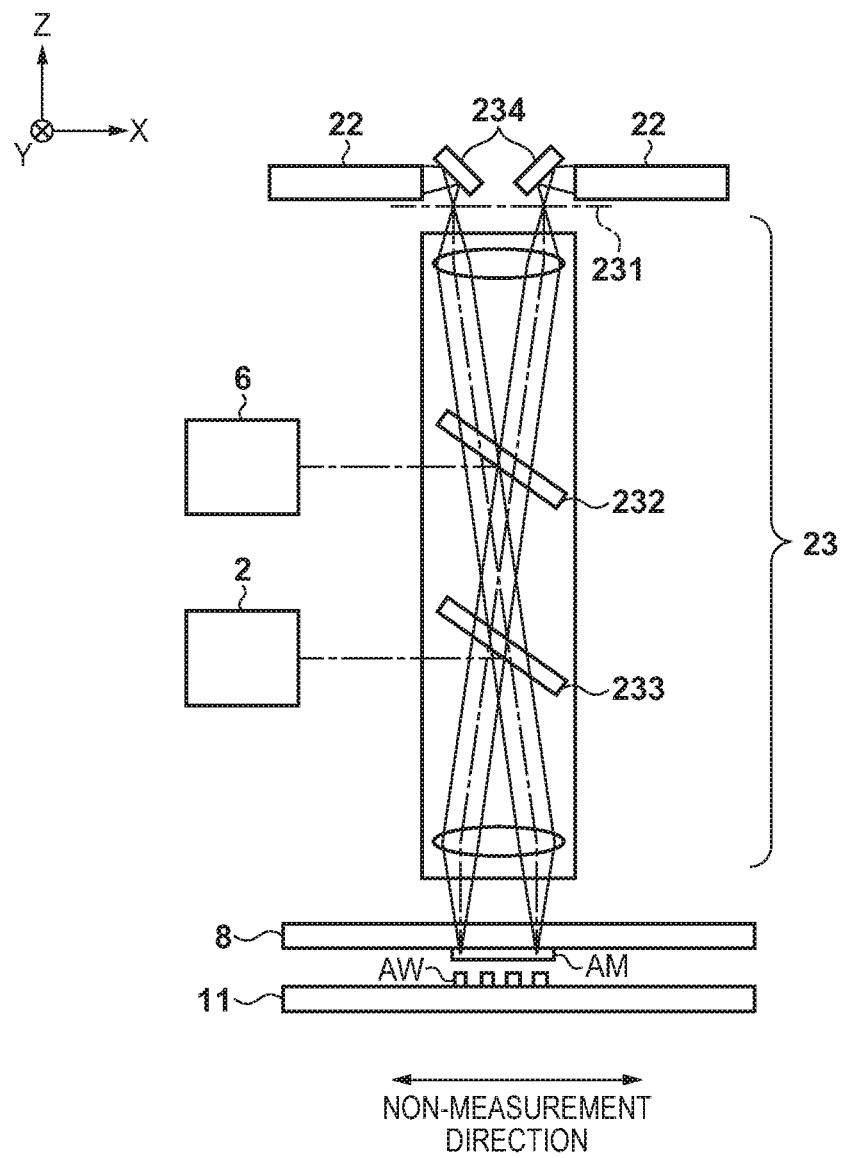
FIG. 7 is a view showing the configurations of a detection unit, heating unit, and curing unit in an imprint apparatus according to the second embodiment.

An imprint apparatus according to the second embodiment of the present invention will be described with reference to FIG. 7. FIG. 7 is a view showing the configurations of a detection unit 22, heating unit 6, and curing unit 2 in the imprint apparatus according to the second embodiment. In the imprint apparatus according to the second embodiment, the configuration other than the configurations of the detection unit 22, heating unit 6, and curing unit 2, and the operation sequence in the imprint process are the same as those in the first embodiment, and a description thereof will not be repeated.

A plurality of marks (marks AM of a mold 8 and marks AW of a substrate 11) are arranged on the mold 8 and the substrate 11 so as to be able to detect a deformation including a magnification component, a trapezoidal component, an arcuate component, or the like in a pattern region 8a and a shot region 11a(see FIGS. 2A to 2D). When one detection unit 22 is configured to detect one mark, a plurality of detection units 22 may be used. To align the mold 8 and the substrate 11 with high accuracy in the imprint apparatus, information about the relative positions of the mold 8 and substrate 11 may be acquired for at least two directions (for example, X and Y directions). In this case, a larger number of detection units 22 may be used. That is, a plurality of detection units 22 may be arranged to quickly measure the shape difference between the pattern region 8a and the shot region 11a with high accuracy in the imprint apparatus. However, when the plurality of detection units 22 are arranged in the imprint apparatus, it may be difficult to ensure the space for arranging the plurality of detection units 22.

On the other hand, the imprint apparatus needs to improve the overlay accuracy between the pattern region 8a and the shot region 11a. Therefore, the substrate 11 may be irradiated with the second light by the heating unit 6 and the shot region 11a may be deformed while detecting the mark AM of the mold 8 and the mark AW of the substrate 11 by the detection unit 22. In the imprint apparatus, the mold 8 and the substrate 11 may be aligned while detecting the mark AM of the mold 8 and the mark AW of the substrate 11 by the detection unit 22 even during curing of a resin 14 by the curing unit 2 by irradiating the resin 14 with the third light. However, if the second light from the heating unit 6 or the third light from the curing unit 2 is reflected by the mold 8 or the substrate 11 and is incident on the detection unit 22, the light which is incident on the detection unit 22 acts as a noise component, and the mark position deviation detection accuracy may decrease.

Hence, the imprint apparatus according to the second embodiment is configured so that the first light from the detection unit 22, the second light from the heating unit 6, and the third light from the curing unit 2 have different wavelengths. The imprint apparatus according to the second embodiment is configured to include an optical system 23 including two beam splitters 232 and 233. The beam splitter 232 is configured to limit incidence, to the detection unit 22, of the second light that has been emitted by the heating unit 6 and reflected by the mold 8 or the substrate 11. The beam splitter 233 is configured to limit incidence, to the detection unit 22, of the third light that has been emitted by the curing unit 2 and reflected by the mold 8 or the substrate 11. The beam splitters 232 and 233 can be dichroic mirrors having a characteristic of transmitting light having one of two different wavelengths and reflecting light having the other wavelength.

In the imprint apparatus according to the second embodiment, the first light emitted by the detection unit 22 passes through the beam splitters 232 and 233, and irradiates the mark AM of the mold 8 and the mark AW of the substrate 11. The first light reflected by these marks passes again through the beam splitters 232 and 233, and is incident on the detection unit 22. The second light emitted by the heating unit 6 is reflected by the beam splitter 232, passes through the beam splitter 233, and irradiates the substrate 11. The third light emitted by the curing unit 2 is reflected by the beam splitter 233 and irradiates the resin 14 supplied onto the substrate. This configuration of the imprint apparatus can suppress incidence, to the detection unit 22, of the second light that has been emitted by the heating unit 6 and reflected by the mold 8 or the substrate 11, and the third light that has been emitted by the curing unit 2 and reflected by the mold 8 or the substrate 11. Accordingly, a decrease in detection accuracy caused by incidence, to the detection unit 22, of the second light from the heating unit 6 and the third light from the curing unit 2 can be prevented, and the mold 8 and the substrate 11 can be overlaid with high accuracy.

In the imprint apparatus according to the second embodiment, the arrangement of the detection unit 22, heating unit 6, and curing unit 2 may be appropriately changed. In this case, the characteristics of the beam splitters 232 and 233 can also be appropriately changed. For example, when the positions of the detection unit 22 and heating unit 6 are interchanged, the beam splitter 232 can be configured to reflect the first light from the detection unit 22 and transmit the second light from the heating unit 6. When the positions of the detection unit 22 and curing unit 2 are interchanged, the beam splitter 233 is configured to reflect the first light from the detection unit 22 and transmit the third light from the curing unit 2. Similarly, even when the positions of the heating unit 6 and curing unit 2 are interchanged, the characteristics of the beam splitters 232 and 233 can be appropriately changed.

Figure 8:
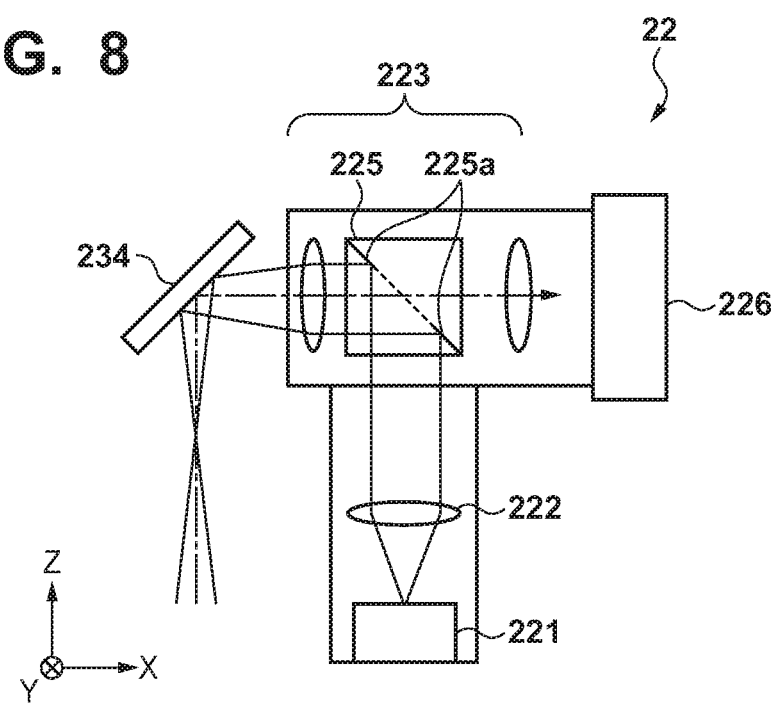
FIG. 8 is a view showing an example of the configuration of the detection unit in the second embodiment.

The configuration of the detection unit 22 in the second embodiment will be described next with reference to FIG. 8. FIG. 8 is a view showing an example of the configuration of the detection unit 22 in the second embodiment. The detection unit 22 according to the second embodiment can include a light source 221, an image sensor 226, an optical system 222 for transmitting light emitted by the light source 221, and an optical system 223 for causing light reflected by the mark AM of the mold 8 and the mark AW of the substrate 11 to be incident on the image sensor 226. The first light emitted by the detection unit 22 is guided to the mold 8 and the substrate 11 via a mirror 234. The first light reflected by the mark AM of the mold 8 and the mark AW of the substrate 11 is guided to the detection unit 22 via the mirror 234.

For example, a halogen lamp or an LED is used as the light source 221, and the light source 221 is configured to emit light (for example, visible rays or infrared rays) that does not contain ultraviolet rays to cure the resin 14. Light emitted by the light source 221 is changed into parallel light through the optical system 222, reflected by a prism 225 of the optical system 223, and emerges as the first light from the detection unit 22. The first light emerging from the detection unit 22 is deflected by the mirror 234 arranged near the projection surface of the optical system 23, and irradiates the mark AM of the mold 8 and the mark AW of the substrate 11. The first light reflected by the mark AM of the mold 8 and the mark AW of the substrate 11 is incident on the detection unit 22 via the mirror 234, passes through the prism 225, and is incident on the image sensor 226. As described above with reference to FIGS. 2A to 2D, the mark AM of the mold 8 and the mark AW of the substrate 11 are configured to have different cycles. Thus, an interference fringe (moire fringe) generated by the interference between diffracted beams traveling from these marks is formed into an image on the image sensor 226.

The optical systems 222 and 223 are configured to share some optical members building them. The prism 225 is arranged on or near the pupil plane of the optical system 222 (optical system 223). A reflection film 225a for reflecting light at the peripheral portion of the pupil plane of the optical system 222 is formed on the bonded surface of the prism 225. The reflection film 225a functions as an aperture stop that defines the light intensity distribution on the pupil plane of the optical system 222. The reflection film 225a also functions as an aperture stop that defines the size (or numerical aperture NA) of the pupil of the optical system 223. The prism 225 may also be a half-prism having a semipermeable film on the bonded surface, or may not be limited to a prism and may be a plate-like optical element constituted by depositing a reflection film on the surface. Further, in order to change the pupil shape of the optical system 222 or 223, the prism 225 may be configured to be replaceable with a prism having another aperture shape by a switching mechanism of a turret or slide mechanism (not shown).

Figure 9:
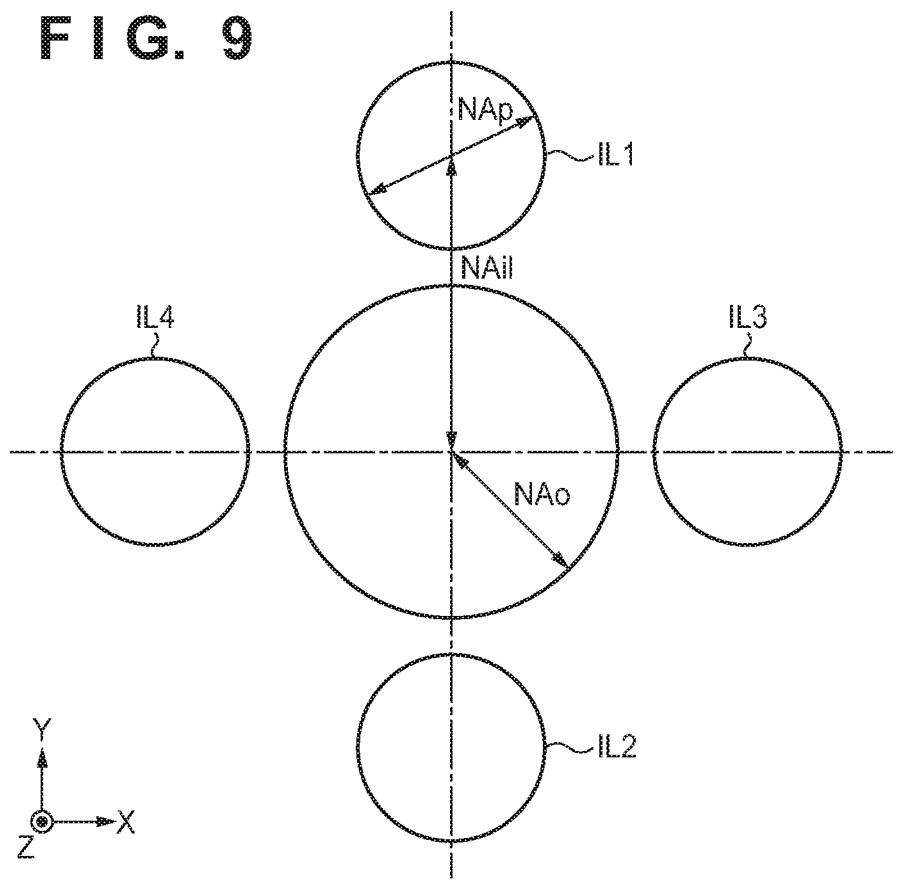
FIG. 9 is a view showing the relationship between the light intensity distribution on the pupil plane and the numerical aperture NA.

FIG. 9 shows the relationship between the light intensity distribution on the pupil plane of the optical system 222 and the numerical aperture NA. In FIG. 9, a numerical aperture $NA_0$ represents the size of the pupil. The light intensity distribution on the pupil plane of the optical system 222 is formed to include four poles IL1 to IL4. By arranging the reflection film 225a on the prism as an aperture stop on the pupil plane of the optical system 222, a light intensity distribution including the plurality of poles IL1 to IL4 can be formed from one light source 221. Therefore, the configuration of the detection unit 22 can be simplified to downsize the detection unit 22. Each of the four poles IL1 to IL4 has a circular shape having a diameter NAp. The poles IL1 and IL2 are arranged at positions spaced apart by NAil respectively in the +Y and −Y directions from a reference point O (center) of the pupil plane. Also, the poles IL3 and IL4 are arranged at positions spaced apart by NAil respectively in the +X and −X directions from the reference point O of the pupil plane.

If the diffraction gratings (the mark AM of the mold 8 and the mark AW of the substrate 11) are detected (illuminated from the vertical direction to detect diffracted light from the vertical direction) in the bright field in order to detect a moire fringe, even 0th-order light from the diffraction grating is detected. Since the 0th-order light is a factor that decreases the contrast of the moire fringe, the detection unit according to the second embodiment adopts a dark field configuration that does not detect 0th-order light. One of the mark AM of the mold 8 and the mark AW of the substrate 11 is formed from a checkerboard diffraction grating so that a moire image can be detected even by the dark field configuration of performing oblique illumination.

Figure 10A:
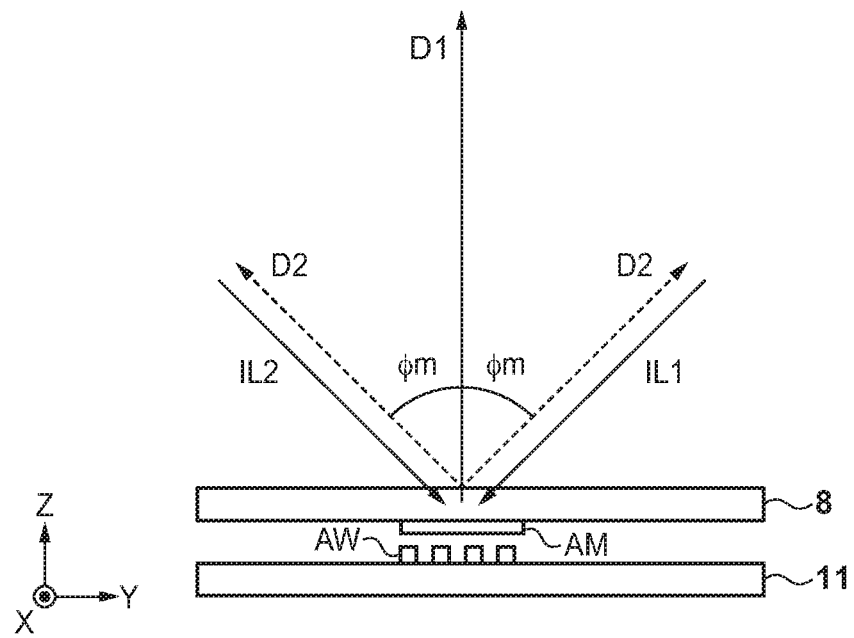
FIG. 10A is a view showing the mark of a mold and the mark of a substrate when viewed from the X direction.
Figure 10B:
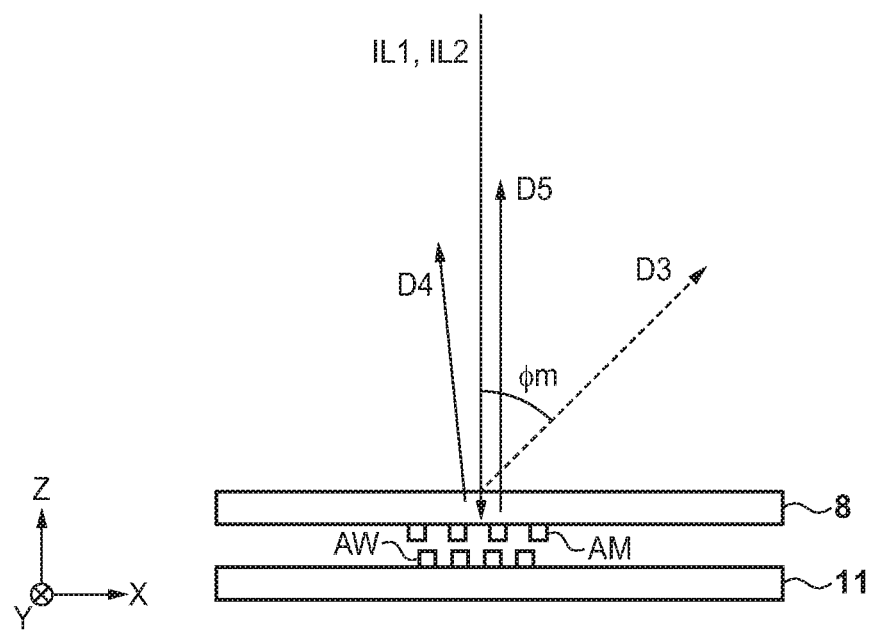
FIG. 10B is a view showing the mark of the mold and the mark of the substrate when viewed from the Y direction.

FIGS. 10A and 10B are views showing the mark AM of the mold 8 and the mark AW of the substrate 11 for detecting the relative positions of the mold 8 and substrate 11 in the X direction when viewed from the X and Y directions. A principle of detecting a moire fringe by the detection unit 22 in a state in which the mark AM of the mold 8 and the mark AW of the substrate 11 are overlaid will be described below. The moire fringe for detecting the relative positions of the mark AM of the mold 8 and the mark AW of the substrate 11 in the X direction is generated by the poles IL1 and IL2 aligned in the Y direction serving as the non-measurement direction.

In FIG. 10A, the mark AM of the mold 8 and the mark AW of the substrate 11 are obliquely illuminated from the Y direction (non-measurement direction) by the poles IL1 and IL2 aligned in the Y direction. Light D1 reflected by the mark AM of the mold 8 and the mark AW of the substrate 11 in the Z direction is not incident on the detection unit 22. In contrast, light D2 diffracted by an angle ϕm by the mark AW of the substrate 11 having a diffraction grating of a cycle $d_m$ in the Y direction is incident on the detection unit 22 (image sensor 22b). The detection unit 22 according to the second embodiment detects ±1st-order diffracted beams having a highest light intensity, out of the diffracted light excluding 0th-order light. In this manner, as for the Y direction (non-measurement direction), the mark AM of the mold 8 is obliquely illuminated from the Y direction, and light diffracted by the mark AW of the substrate 11 in the Y direction is detected.

Next, diffracted light in the X direction (measurement direction) will be explained with reference to FIG. 10B. The poles IL1 and IL2 aligned in the Y direction on the pupil plane are incident on the mark AM of the mold 8 and the mark AW of the substrate 11 in a direction perpendicular to the X direction. At this time, ±1st-order diffracted beams will be examined, as in the Y direction. Light D4 that has been diffracted into +/−1st-order light by the mark AM of the mold 8 and −/+1st-order light by the mark AW of the substrate 11 is incident on the detection unit 22 at a small angle with respect to the X direction in accordance with the difference in the cycle of the diffraction grating between the mark AM of the mold 8 and the mark AW of the substrate 11. Light D3 diffracted by either of the mark AM of the mold 8 and the mark AW of the substrate 11 emerges at the angle ϕm. Since the light D3 serves as noise without generating a moire fringe, the light D3 may not be incident on the detection unit 22.

Light D5 (0th-order diffracted light) diffracted by neither the mark AM of the mold 8 nor the mark AW of the substrate 11 in the X direction is reflected by the mark AM of the mold 8 and the mark AW of the substrate 11 in the Z direction, and is incident on the detection unit 22. Diffracted light that has been diffracted into +/−nth-order diffracted light and −/+nth-order diffracted light (0th-order diffracted light in total) by the mark AM of the mold 8 in the X direction before and after reflection by the substrate 11 without diffraction by the mark AW of the substrate 11 also is incident on the detection unit 22. These beams serve as a factor that decreases the contrast of the moire fringe without forming the moire fringe. However, in this embodiment, the mark AW of the substrate 11 includes a checkerboard diffraction grating, the phases of diffracted beams from adjacent gratins shift by π, and the diffracted beams cancel each other. As a result, the intensity of the light D5 decreases, and a high-contrast moire fringe can be detected.

Detection of a moire fringe for measuring the relative positions of the mold 8 and substrate 11 in the X direction has been explained. This principle also applies to detection of a moire fringe for measuring relative positions in the Y direction. The moire fringe for measuring relative positions in the Y direction is generated by illuminating two diffraction gratings by the poles IL3 and IL4 aligned in the Y direction.

Third Embodiment

Figure 11:
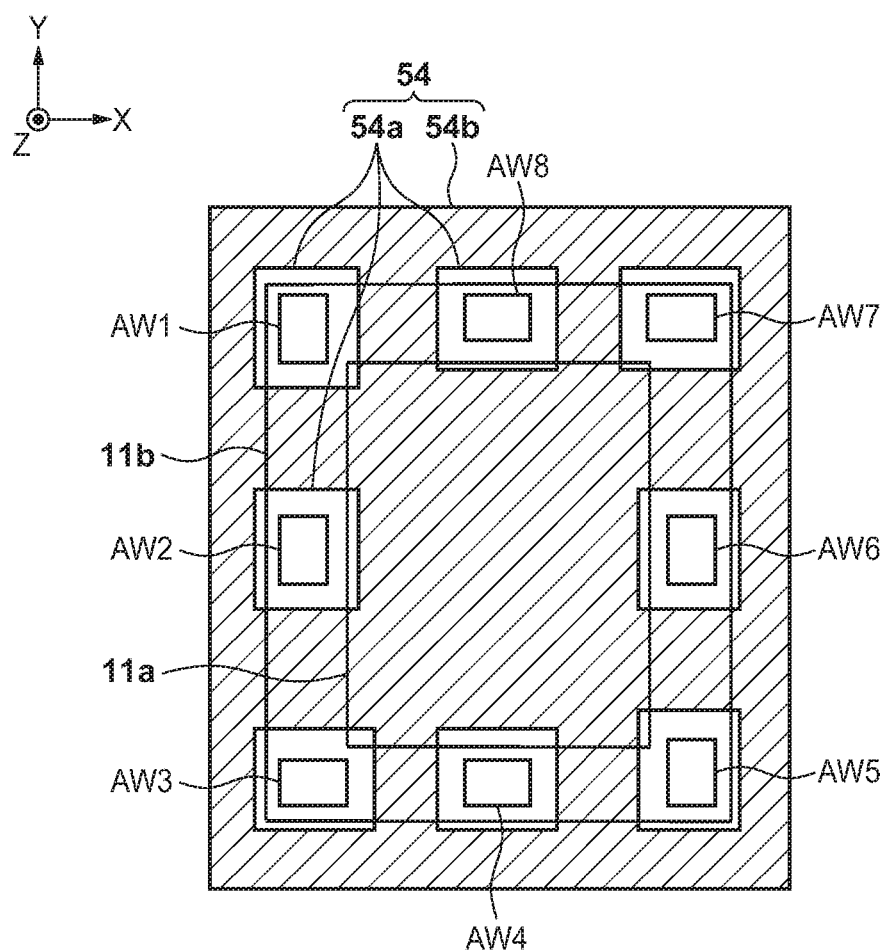
FIG. 11 is a view showing the region of a substrate irradiated with the second light emitted by the heating unit.

An imprint apparatus according to the third embodiment of the present invention will be described with reference to FIG. 11. FIG. 11 is a view showing a region 54 of a substrate 11 irradiated with the second light emitted by a heating unit 6. The imprint apparatus according to the third embodiment has the same apparatus configuration as that of the imprint apparatus according to the first embodiment, and a description of the apparatus configuration will not be repeated.

Even in the imprint apparatus according to the third embodiment, a shot region 11a may be deformed by the heating unit 6 while detecting a mark AM of a mold 8 and a mark AW of the substrate 11 by a detection unit 22, in order to improve the alignment accuracy between the mold 8 and the substrate 11. However, in this alignment method, the second light emitted by the heating unit 6 is reflected by the mark AW of the substrate 11 and is incident on the detection unit 22 (light receiving unit 22b), and the mark position deviation detection accuracy may decrease. To prevent this, in the imprint apparatus according to the third embodiment, the intensity of the second light in the region 54 of the substrate 11 irradiated with the second light from the heating unit 6 is controlled to suppress incidence, to the detection unit 22, of the second light that has been emitted by the heating unit 6 and reflected by the mark AW of the substrate 11. That is, a control unit 7 controls a heating unit 6 (adjustment unit) so that the intensity of the second light at each of portions 54a including the marks AW becomes lower than the maximum intensity of the second light at a portion 54b other than the portions 54a. In particular, the control unit 7 may control the heating unit 6 (adjustment unit) not to irradiate the mark AW of the substrate 11 with the second light emitted by the heating unit 6.

For example, in step S106 of the flowchart shown in FIG. 4, the control unit 7 decides the correction amount of the shot region 11a in accordance with the shape difference between a pattern region 8a and the shot region 11a. In step S109, the control unit 7 controls the heating unit 6 (adjustment unit) to irradiate the substrate 11 with the second light based on the correction amount of the shot region 11a that has been acquired in step S106, so as not to irradiate the portion 54a including the mark AW with the second light from the heating unit 6. At this time, a temperature distribution given to the shot region 11a becomes a temperature distribution in which the rise of the temperature at the portion 54a including the mark AW is suppressed. The imprint apparatus according to the third embodiment can prevent a decrease in detection accuracy caused by incidence of the second light emitted by the heating unit 6 to the detection unit 22 (light receiving unit 22b). The imprint apparatus according to the third embodiment can deform the shot region 11a by irradiating the substrate 11 with the second light by the heating unit 6 while detecting a position deviation between the mark AM of the mold 8 and the mark AW of the substrate 11 by the detection unit 22. That is, the mold 8 and the substrate 11 can be overlaid with high accuracy.

There is a fear of the influence on the deformation of the shot region 11a by not irradiating the mark AW of the substrate 11 with the second light from the heating unit 6. However, the dimensions of one mark AW are about 50 μm×100 μm, and even the total of a plurality of marks AW (eight in FIG. 9) arranged in the shot region 11a is equal to or smaller than 0.005% of 26 mm×33 mm dimensions of the shot region 11a. For this reason, even if the heating unit 6 (adjustment unit) is controlled not to irradiate the portion 54a including the mark AW with the second light from the heating unit 6, the deformation of the shot region 11a is hardly influenced. The control unit 7 may control the heating unit 6 (adjustment unit) so that the intensity of light irradiating the portion including the mark AM becomes lower than the maximum intensity of light irradiating a portion other than the portion including the mark AM in the region of the mold 8 irradiated with the second light from the heating unit 6. This can suppress incidence, to the detection unit 22 (light receiving unit 22b), of the second light that has been emitted by the heating unit 6 and reflected by the mark AM of the mold 8.

Fourth Embodiment

An imprint apparatus according to the fourth embodiment of the present invention will be described with reference to FIGS. 5, 6, and 11. The imprint apparatus according to the fourth embodiment basically has the same apparatus configuration as that of the imprint apparatus 1 according to the first embodiment, and only a difference will be described.

Even in the imprint apparatus according to the fourth embodiment, a shot region 11a may be deformed by a heating unit 6 while detecting a mark AM of a mold 8 and a mark AW of a substrate 11 by a detection unit 22, in order to improve the alignment accuracy between the mold 8 and the substrate 11. However, in this alignment method, unless the second light emitted by the heating unit 6 is controlled, the second light reflected by the mark AW of the substrate 11 is incident on the detection unit 22 (light receiving unit 22b), and the mark position deviation detection accuracy may decrease.

In the imprint apparatus according to the fourth embodiment, therefore, the detection unit 22 and the heating unit 6 are configured so that the second light that has been emitted by the heating unit 6 and reflected by the mark AW of the substrate 11 and the mark AM is controlled to be incident on the detection unit 22. In addition, a control unit 7 controls the heating unit 6 so that the intensity of the second light at each of portions 54a including the marks AW of the substrate 11 irradiated with the second light from the heating unit 6 becomes lower than the maximum intensity of the second light at a portion 54b other than the portions 54a. As a result, the position deviation is detected from the second light. More specifically, the position deviation between the mold 8 and the substrate 11 is detected by using the second light that is controlled by the control unit 7 to irradiate the portion 54a. The control unit 7 controls the intensity of the second light at the portion 54a as long as a detection signal by the detection unit 22 is not saturated. Accordingly, saturation of the detection signal by incidence of the second light from the heating unit 6 to the light receiving unit 22b can be suppressed, and a decrease in detection accuracy can be prevented.

For example, in step S103 of the flowchart shown in FIG. 4, if the distance between the mold 8 and the substrate 11 that are arranged to face each other falls within a predetermined range, the detection unit 22 can observe an interference fringe even without any contact between a resin 14 on the substrate and the mold 8. In step S103, the first light emitted by an emitting unit 22a controlled by the control unit 7 is reflected (diffracted) by the mark AW of the substrate 11 and is incident on the light receiving unit 22b. The control unit 7 controls the detection unit 22 to detect a position deviation between the mark AM (first mark) of the mold 8 and the mark AW (second mark) of the substrate 11. Based on the detection result from the detection unit 22, the control unit 7 can acquire the shape difference between a pattern region 8a of the mold 8 and the shot region 11a of the substrate 11. Subsequently in step S104, the control unit 7 controls a mold driving unit 16 to bring the pattern region 8a of the mold 8 and the resin 14 on the substrate into contact with each other, that is, shorten the distance between the mold 8 and the substrate 11.

In step S105, the control unit 7 controls the detection unit 22 to detect a position deviation between the mark AM of the mold 8 and the mark AW of the substrate 11. In the imprint apparatus according to the fourth embodiment, the parameter of the detection unit 22 and that of the heating unit 6 are set so that the second light emitted by the heating unit 6 is incident on the light receiving unit 22b of the detection unit 22, unlike the imprint apparatus 1 according to the first embodiment. Note that the parameter of the detection unit 22 is an element of the detection unit 22 that can be set when detecting a position deviation between the mark AM of the mold 8 and the mark AW of the substrate 11. At least one of the wavelength of the first light from the emitting unit 22a, the direction in which the emitting unit 22a emits the first light, the direction in which the light receiving unit 22b receives the first light, and the numerical aperture of the detection unit 22 (light receiving unit 22b) can be set as the parameter of the detection unit 22. The parameter of the heating unit 6 is an element of the heating unit 6 that can be set when irradiating the substrate 11 with the second light for heating the substrate 11. At least one of the wavelength of the second light from the heating unit 6, and the direction in which the second light from the heating unit is incident on the substrate 11 can be set as the parameter of the heating unit 6.

For example, in the configuration of the detection unit 22 according to the first embodiment, the first light that has been emitted by the emitting unit 22a and diffracted by the mark AW of the substrate 11 having a diffraction grating of a cycle $d_m$ in the non-measurement direction is incident on the light receiving unit 22b when equation (7) is satisfied:

$$d_m(\sin \alpha_a + \sin \beta_a) = m\lambda_a \quad (7)$$

where $\alpha_a$ is the angle between the reference axis (axis (Z-axis) perpendicular to the substrate surface) and the direction in which the emitting unit 22a emits the first light, $\beta_a$ is the angle between the reference axis and the direction in which the light receiving unit 22b receives the first light reflected by the mark AW of the substrate 11, $\lambda_a$ is the wavelength of the first light, and m is the order of light, diffracted by the substrate 11, of the first light emitted by the emitting unit 22a.

Further, in the configurations of the detection unit 22 and heating unit 6 according to the first embodiment, the second light that has been emitted by the heating unit 6 and diffracted by the mark AW of the substrate 11 is incident on the light receiving unit 22b when inequality (8) is satisfied:

$$d_m(\sin \alpha_n + \sin(\beta_a - \theta)) \leq n\lambda_h \leq d_m(\sin \alpha_h + \sin(\beta_a + \theta)) \quad (8)$$

where $\alpha_h$ is the angle ($\alpha_h = 0$ in this embodiment) between the reference axis and the direction in which the second light from the heating unit 6 is incident on the substrate 11, sine, is the numerical aperture of the light receiving unit 22b, $\lambda_h$ is the wavelength of the second light, and n is the diffraction order of light, diffracted by the substrate 11, of the second light emitted by the heating unit 6. Note that the refractive index in the atmosphere in which the first light and the second light pass is set to be 1.

In step S109 according to the fourth embodiment, the control unit 7 controls the second light satisfying equation (7) and inequality (8) so that the intensity of the second light at the portion 54a including the mark AW of the substrate 11 becomes lower than the maximum intensity of the second light at the portion 54b. The diffraction grating on the mark AM of the mold 8 and the diffraction grating on the mark AW of the substrate 11 are configured to have slightly different pitches in the measurement direction. For this reason, light that has been reflected by the mark AM of the mold 8 and the mark AW of the substrate 11 and has been incident on the light receiving unit 22b generates, on an image sensor, an interference fringe corresponding to the pitch difference between the diffraction grating on the mark AM of the mold 8 and the diffraction grating on the mark AW of the substrate 11. The second light which is incident on the detection unit 22 generates a moire fringe, and an image sensor 224 senses this moire fringe and performs an image process. Hence, the position deviation between the mark AM of the mold 8 and the mark AW of the substrate 11 can be detected. At this time, the control unit 7 controls the intensity of the second light at the portion 54a as long as a detection signal by the detection unit 22 is not saturated.

In step S110, the control unit 7 controls to emit the second light from the heating unit 6. In addition, the control unit 7 controls the detection unit 22 to detect a position deviation between the mark AM of the mold 8 and the mark AW of the substrate 11. Based on the detection result of the second light which is incident on the detection unit 22, the control unit 7 can acquire the shape difference between the pattern region 8a of the mold 8 and the shot region 11a of the substrate 11.

From this, the detection unit 22 and the heating unit 6 may be configured to satisfy equation (7) and inequality (8), in order to diffract the second light from the heating unit 6 by the substrate 11 (mark AW) and cause the second light to be incident on the light receiving unit 22b. The imprint apparatus according to the fourth embodiment can suppress saturation of a detection signal caused by incidence of the second light from the heating unit 6 to the light receiving unit 22b, and can prevent a decrease in detection accuracy. The imprint apparatus can deform the shot region 11a by irradiating the substrate 11 with the second light by the heating unit 6 while detecting a position deviation between the mark AM of the mold 8 and the mark AW of the substrate 11 by the detection unit 22. That is, the mold 8 and the substrate 11 can be overlaid with high accuracy.

This embodiment has exemplified the use of two light sources, that is, a light source that generates the first light for detecting a position deviation between the mark AM of the mold 8 and the mark AW of the substrate 11, and a light source that generates the second light for heating and deforming the substrate 11. For example, a case can be assumed, in which a light source having a wide-band wavelength such as a halogen lamp with low coherence is used as the light source that generates the first light, and a laser with high coherence is used for the second light. When the distance between the mold 8 and the substrate 11 is large, the high-coherence light source generates multiple interference between the mold 8 and the substrate 11, and a signal detected by the light receiving unit 22b may be distorted. For this reason, when the distance between the mold 8 and the substrate 11 is large, the position deviation can be detected with high accuracy by detecting a position deviation using the low-coherence light source that generates the first light. When the distance between the mold 8 and the substrate 11 is small, the position deviation is detected by using the high-coherence light source that generates the second light. In this way, the light for detecting a position deviation can be selected from the first light and the second light in accordance with the distance between the mold 8 and the substrate 11.

However, the present invention is not limited to this, and a laser beam source that generates the second light may be used for both detection of a position deviation between the mark AM of the mold 8 and the mark AW of the substrate 11, and heating of the substrate 11. In this case, detection of a position deviation in step S103 is not performed, and detection of a position deviation by the second light is performed in a state in which the distance between the mold 8 and the substrate 11 is small. In this configuration, the emitting unit 22a that generates the first light in FIGS. 5 and 6 can be omitted to simplify the configuration of the imprint apparatus.

<Embodiment of Method of Manufacturing Article>

A method of manufacturing an article according to an embodiment of the present invention is suitable for manufacturing an article such as a microdevice (for example, a semiconductor device) or an element having a microstructure. The method of manufacturing an article according to the embodiment includes a step of forming a pattern on a resin applied to a substrate by using the imprint apparatus (step of performing the imprint process on the substrate), and a step of processing the substrate on which the pattern has been formed in the preceding step. Further, this manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-011784 filed on Jan. 24, 2014, which is hereby incorporated by reference herein in its entirety.

The invention claimed is:

1. An imprint apparatus that molds an imprint material on a shot region of a substrate by using a mold on which a pattern is formed, comprising:
   a detection unit configured to irradiate a first mark of the mold and a second mark of the substrate with first light, detect the first light from the first mark and the second mark, and measure a position deviation between the first mark and the second mark;
   a heating unit configured to irradiate the substrate via the mold with second light different in wavelength from the first light, and heat the substrate to deform the shot region with the second light; and
   a control unit configured to control alignment between the mold and the substrate based on the position deviation measured by the detection unit,
   a wavelength selection element configured to suppress incidence, to the detection unit, of the second light reflected by at least one of the mold and the substrate.

2. The apparatus according to claim 1, wherein the wavelength selection element includes a beam splitter configured to transmit one of the first light and the second light, reflect the other one of the first light and the second light, guide, to the detection unit, the first light from the first mark and the second mark, and prevent the second light reflected by at least one of the mold and the substrate from being incident on the detection unit.

3. The apparatus according to claim 2, wherein the beam splitter comprises a dichroic mirror.

4. The apparatus according to claim 1, further comprising:
a curing unit configured to cure the imprint material by irradiating the imprint material with third light; and
a second beam splitter configured to transmit one of the first light and the third light, reflect the other one of the first light and the third light, guide, to the detection unit, the first light from the first mark and the second mark, and prevent the third light reflected by at least one of the mold and the substrate from being incident on the detection unit.

5. The apparatus according to claim 4, wherein while controlling the detection unit to measure the position deviation even during curing of the imprint material by the curing unit, the control unit controls heating of the substrate by the heating unit based on the measured position deviation and controls alignment between the mold and the substrate.

6. The apparatus according to claim 4, wherein the second beam splitter comprises a dichroic mirror.

7. The apparatus according to claim 1, further comprising a curing unit configured to cure the imprint material by irradiating the imprint material via the mold with third light for curing,
wherein the control unit is configured to control the alignment while curing the imprint material by the curing unit, and
wherein the direction in which the detection unit receives the first light, the numerical aperture of the detection unit, a wavelength of the third light, and a direction of the third light which is incident on the substrate are set such that the third light reflected by at least one of the mold and the substrate is suppressed to detect by the detection unit in the alignment.

8. The apparatus according to claim 7, wherein while controlling the detection unit to measure the position deviation even during curing of the imprint material by the curing unit, the control unit controls heating of the substrate by the heating unit based on the measured position deviation and controls alignment between the mold and the substrate.

9. The apparatus according to claim 7, wherein
at least one of the first mark and the second mark includes a diffraction grating, and
letting $d_m$ be a cycle of the diffraction grating, $\alpha_a$ be an angle between a reference axis perpendicular to a surface of the substrate and a direction in which the detection unit emits the first light, $\beta_a$ be an angle between the reference axis and a direction in which the detection unit receives the first light, $\alpha_e$ be an angle between the reference axis and a direction of the third light which is incident on the substrate, sin θ be a numerical aperture of the detection unit, $\lambda_a$ be a wavelength of the first light, $\lambda_e$ be a wavelength of the third light, m be a diffraction order at which light emitted by the detection unit is diffracted by the diffraction grating, and n be a diffraction order at which light emitted by the curing unit is diffracted by the diffraction grating, the detection unit and the curing unit are configured to satisfy:

$d_m(\sin \alpha_a + \sin \beta_a) = m\lambda_a$ and satisfy:

$d_m(\sin \alpha_e + \sin(\beta_a - \theta)) > n\lambda_e$ or $d_m(\sin \alpha_e + \sin(\beta_a + \theta)) < n\lambda_e$.

10. The apparatus according to claim 1, wherein the detection unit includes an emitting unit configured to emit the first light toward the first mark and the second mark, and a light receiving unit configured to receive the first light reflected by the first mark and the second mark.

11. The apparatus according to claim 10, wherein the detection unit is configured to include a common part between an optical path in the emitting unit and an optical path in the light receiving unit.

12. The apparatus according to claim 1, wherein while controlling the detection unit to measure the position deviation, the control unit controls heating of the substrate by the heating unit based on the measured position deviation and controls alignment between the mold and the substrate.

13. The apparatus according to claim 1, wherein the direction in which the detection unit receives the first light, the numerical aperture of the detection unit, the wavelength of the second light and the direction of the second light which is incident on the substrate are set so as to suppress to detect the second light reflected by at least one of the mold and the substrate by the detection unit, during heating the substrate by irradiating the substrate with the second light.

14. The apparatus according to claim 1, wherein a parameter of the detection unit, a parameter of the heating unit, or parameters of the detection unit and the heating unit is/are set so as to suppress to detect the second light reflected by at least one of the first mark of the mold and the second mark of the substrate by the detection unit in the alignment during heating the substrate.

15. A method of manufacturing an article, the method comprising:
forming a pattern on a substrate using an imprint apparatus; and
processing the substrate, on which the pattern has been formed, to manufacture the article,
wherein the imprint apparatus, which molds an imprint material on a shot region of a substrate by using a mold on which a pattern is formed, includes:
a detection unit configured to irradiate a first mark of the mold and a second mark of the substrate with first light, detect the first light from the first mark and the second mark, and measure a position deviation between the first mark and the second mark;
a heating unit configured to irradiate the substrate via the mold with second light different in wavelength from the first light, and heat the substrate to deform the shot region with the second light; and
a control unit configured to control alignment between the mold and the substrate based on the position deviation measured by the detection unit,
a wavelength selection element configured to suppress incidence, to the detection unit, of the second light reflected by at least one of the mold and the substrate.

16. An imprint apparatus that molds an imprint material on a shot region of a substrate by using a mold on which a pattern is formed, comprising:
a detection unit configured to irradiate a first mark of the mold and a second mark of the substrate with first light, detect the first light from the first mark and the second mark, and measure a position deviation between the first mark and the second mark;
a heating unit configured to irradiate the substrate via the mold with second light for heating, and heat the substrate to deform the shot region with the second light; and
a control unit configured to control heating of the substrate by the heating unit based on the position deviation measured by the detection unit, and control alignment between the mold and the substrate based on the position deviation measured by the detection unit,
wherein the control unit forms an intensity distribution of the second light on the substrate to set an intensity of the second light irradiating a portion including the second mark to be smaller than a maximum intensity of the second light irradiating a portion other than the portion including the second mark in a region of the substrate that is irradiated with the second light.

17. The apparatus according to claim 16, wherein the control unit forms the intensity distribution of the second light on the substrate not to irradiate the portion including the second mark with the second light.

18. The apparatus according to claim 16, wherein the control unit forms the intensity distribution of the second light on the mold to set the intensity of the second light irradiating a portion including the first mark to be smaller than a maximum intensity of the second light irradiating a portion other than the portion including the first mark in a region of the mold that is irradiated with the second light.

19. The apparatus according to claim 16, wherein the detection unit detects the position deviation between the first mark and the second mark by detecting the second light for heating that irradiates the first mark of the mold and the second mark of the substrate.

20. The apparatus according to claim 16, wherein
at least one of the first mark and the second mark includes a diffraction grating, and
letting $d_m$ be a cycle of the diffraction grating, $\alpha_a$ be an angle between a reference axis perpendicular to a surface of the substrate and a direction in which the detection unit emits the first light, $\beta_a$ be an angle between the reference axis and a direction in which the detection unit receives the first light, $\alpha_h$ be an angle between the reference axis and a direction of the second light which is incident on the substrate, $\sin \theta$ be a numerical aperture of the detection unit, $\lambda_a$ be a wavelength of the first light, $\lambda_h$ be a wavelength of the second light, m be a diffraction order at which light emitted by the detection unit is diffracted by the diffraction grating, and n be a diffraction order at which light emitted by the heating unit is diffracted by the diffraction grating, the detection unit and the heating unit are configured to satisfy:

$$d_m(\sin \alpha_a + \sin \beta_a) = m\lambda_a$$

and satisfy:

$$d_m(\sin \alpha_h + \sin(\beta_a - \theta)) \leq n\lambda_h \leq d_m(\sin \alpha_h + \sin(\beta_a + \theta)).$$

21. The apparatus according to claim 16, wherein the control unit selects, from the first light and the second light in accordance with a distance between the mold and the substrate that are arranged to face each other, light that irradiates the first mark of the mold and the second mark of the substrate to detect the position deviation between the first mark and the second mark by the detection unit.

22. The apparatus according to claim 16, wherein a single light source emits the first light that irradiates the first mark of the mold and the second mark of the substrate to detect the position deviation between the first mark and the second mark, and the second light for heating.

23. The apparatus according to claim 22, wherein
at least one of the first mark and the second mark includes a diffraction grating, and
letting $d_m$ be a cycle of the diffraction grating, $\beta_a$ be an angle between a reference axis perpendicular to a surface of the substrate and a direction in which the detection unit receives the second light, $\alpha_h$ be an angle between the reference axis and a direction of the second light which is incident on the substrate, $\sin \theta$ be a numerical aperture of the detection unit, $\lambda_h$ be a wavelength of the second light, and n be a diffraction order of light emitted by the heating unit, the detection unit and the heating unit are configured to satisfy:

$$d_m(\sin \alpha_h + \sin(\beta_a - \theta)) \leq n\lambda_h \leq d_m(\sin \alpha_h + \sin(\beta_a + \theta)).$$

24. The apparatus according to claim 16, wherein the first light and the second light have different wavelengths.

25. A method of manufacturing an article, the method comprising:
forming a pattern on a substrate using an imprint apparatus; and
processing the substrate, on which the pattern has been formed, to manufacture the article,
wherein the imprint apparatus, which molds an imprint material on a shot region of a substrate by using a mold on which a pattern is formed, includes:
a detection unit configured to irradiate a first mark of the mold and a second mark of the substrate with first light, detect the first light from the first mark and the second mark, and measure a position deviation between the first mark and the second mark;
a heating unit configured to irradiate the substrate via the mold with second light for heating, and heat the substrate to deform the shot region with the second light; and
a control unit configured to control heating of the substrate by the heating unit based on the position deviation measured by the detection unit, and control alignment between the mold and the substrate based on the position deviation measured by the detection unit,
wherein the control unit forms an intensity distribution of the second light on the substrate to set an intensity of the second light irradiating a portion including the second mark to be smaller than a maximum intensity of the second light irradiating a portion other than the portion including the second mark in a region of the substrate that is irradiated with the second light.

* * * * *